United States Patent [19]
Kayano et al.

[11] Patent Number: 5,614,804
[45] Date of Patent: Mar. 25, 1997

[54] METHOD OF DETECTING RESIDUAL CAPACITY OF BATTERY FOR USE ON ELECTRIC VEHICLE

[75] Inventors: Morio Kayano; Kazunori Watanabe, both of Wako, Japan

[73] Assignee: Honda Giken Kogyo Kabushiki Kaisha, Tokyo, Japan

[21] Appl. No.: 364,654

[22] Filed: Dec. 27, 1994

[30] Foreign Application Priority Data

Dec. 27, 1993 [JP] Japan .................................. 5-332572

[51] Int. Cl.$^6$ .......................... H02J 7/00; H01M 10/44
[52] U.S. Cl. ............................................ 320/13; 320/48
[58] Field of Search ................................ 320/13, 48, 43; 324/426, 427, 428, 429, 431, 432, 433

[56] References Cited

U.S. PATENT DOCUMENTS

| | | | |
|---|---|---|---|
| 5,043,651 | 8/1991 | Tamura | 320/48 X |
| 5,404,106 | 4/1995 | Matsuda | 324/431 |
| 5,412,323 | 5/1995 | Kato et al. | 324/429 |
| 5,422,822 | 6/1995 | Toyota et al. | 324/427 X |

*Primary Examiner*—Peter S. Wong
*Assistant Examiner*—Patrick B. Law
*Attorney, Agent, or Firm*—Lyon & Lyon

[57] ABSTRACT

Based on the difference between a battery voltage immediately after the battery is left to stand and the battery voltage upon elapse of the period of time after the battery has been left to stand, it is determined whether the battery has been in a charge mode or a discharge mode immediately before the battery is left to stand. If the battery has been in the charge mode, then a residual capacity is determined from the battery voltage at a predetermined time. When the battery is being discharged, then a maximum battery output is calculated based on a discharge current. If the residual capacity of the battery is determined as being virtually zero based on the maximum output, then the residual capacity is corrected with a corrective capacity for correcting for a change in the residual capacity due to a degradation of the battery, thus determining the residual capacity of the required charge quantity is calculated from the detected residual capacity and a stored rated capacity of the battery, and a temperature corrective coefficient for correcting the required charge quantity is determined. The residual capacity of the battery is determined based on an actual charge quantity indicative of an integrated average charging current at predetermined periods and the charging efficiency based on battery voltage during charging.

26 Claims, 19 Drawing Sheets

(TABLE T1)

(TABLE T2)

(TABLE T3)

(TABLE T4)

(TABLE T5)

(TABLE T6)

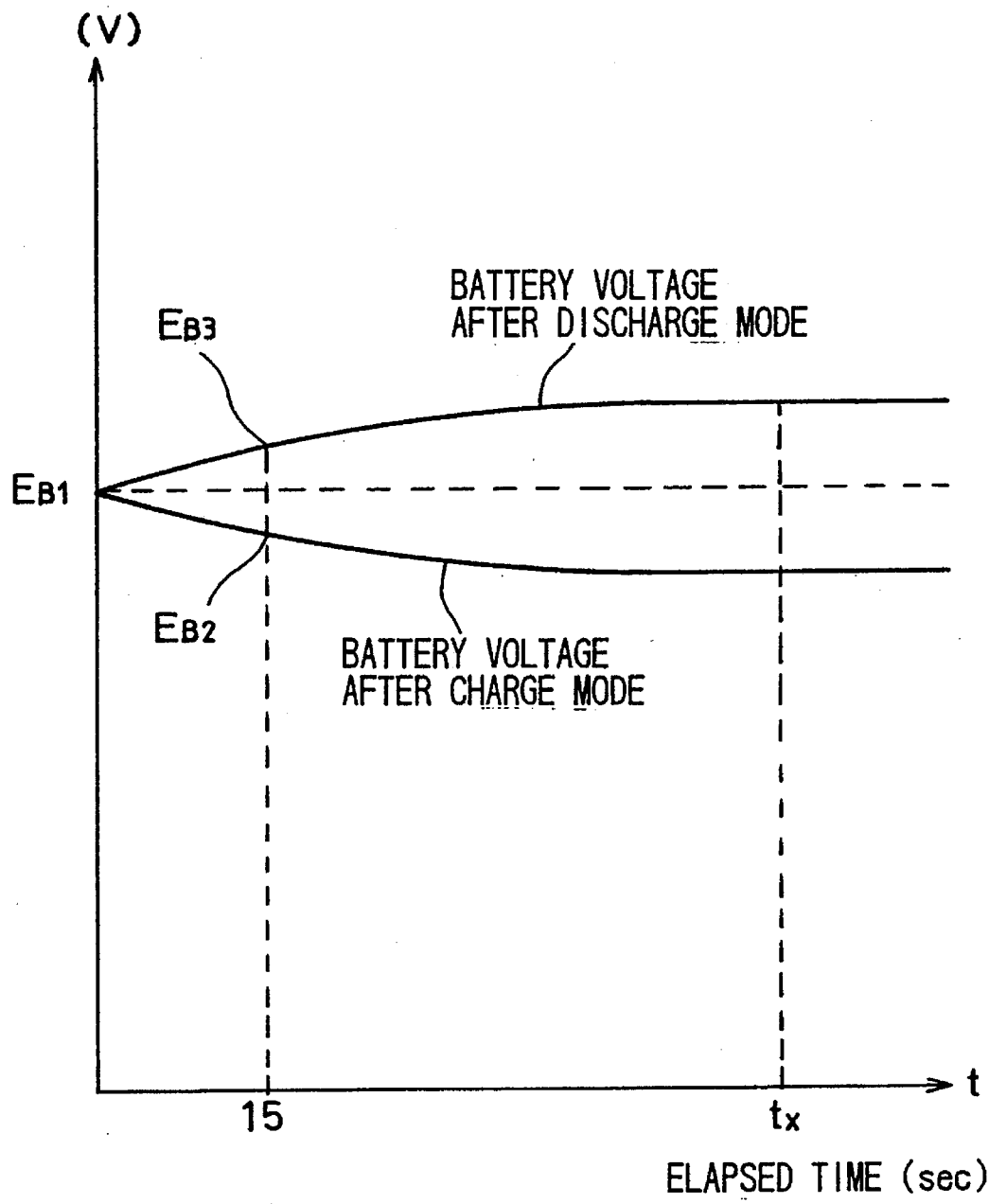

METHOD OF DETECTING RESIDUAL CAPACITY OF BATTERY FOR USE ON ELECTRIC VEHICLE

BACKGROUND OF THE INVENTION

1. Field of the Invention

The present invention relates to a method of detecting the residual capacity of a battery for use on an electric vehicle, and more particularly to a method of detecting the residual capacity of a battery for energizing an electric motor to propel an electric vehicle while the battery is being discharged, charged, and left to stand.

2. Description of the Related Art

Electric vehicles carry secondary batteries that are chargeable for reuse as a power supply for energizing motors for propelling the electric vehicles and various electric accessories.

The batteries on electric vehicles may be in a discharging condition in which they supply an electric current to the motors and electric accessories, a charging condition in which they are charged by an electric current supplied from a battery charger, and a standing mode in which they are neither being discharged nor charged but the electric vehicles are left to stand.

For detecting the residual capacity of a battery on an electric vehicle, it is customary to integrate discharge currents at given periods of time, thereby calculating an integrated discharge quantity when the battery is being discharged, either subtract the integrated discharge quantity from a residual capacity of the battery immediately before the battery starts being discharged or integrate charging currents at given periods of time when the battery is charged, thereby calculating an integrated charge quantity, and adding the integrated charge quantity to the residual capacity of the battery immediately before the battery starts being discharged. The calculated residual capacity of the battery is displayed on a residual capacity indicator on the front instrumental panel or the like of the electric vehicle.

The driver of the electric vehicle sees the displayed residual capacity of the battery, and charges the battery with a battery charger before the residual capacity indicator points to an indication "0", i.e., an empty level.

According to the above conventional process of calculating the residual capacity of a battery, the calculated residual capacity tends to differ from the actual residual capacity of the battery because of a detection error of the charging current which is supplied to the battery when the battery is charged and a detection error of the discharge current which flows from the battery when the battery is discharged.

Another problem is that it is difficult to detect the residual capacity of a battery with high accuracy because the residual capacity varies depending on the temperature of the battery, the aging of the battery, and the discharge current per unit time.

If the residual capacity indicator displays a residual capacity higher than an actual residual capacity, then the driver may be liable to determine a time to charge the battery in error. For example, the actual residual capacity may reach the empty level even though the residual capacity indicator does not point to the empty level. When this happens, the speed of travel of the electric vehicle suddenly drops, and the electric vehicle is no longer able to run normally.

SUMMARY OF THE INVENTION

It is therefore an object of the present invention to provide a method of detecting the residual capacity of a battery for use on an electric vehicle highly accurately while the battery is being discharged, charged, and left to stand, without the danger of displaying the detected residual capacity at a level higher than an actual residual capacity of the battery.

According to the present invention, the above object can be achieved by a method of detecting the residual capacity of a battery for energizing an electric motor to propel an electric vehicle while the battery is being discharged, based on an initial value of the residual capacity of the battery upon a transition of the battery from another condition to a discharging condition and a discharge current at every predetermined period from said battery after said transition, said method comprising the steps of calculating a maximum output which can be produced from said battery based on the discharge current at every predetermined period from said battery and a battery voltage while the battery is being discharged, calculating a maximum output density by dividing said maximum output by a weight of said battery and determining whether the residual capacity of the battery is virtually zero or not based on the maximum output density, calculating a degradation error corrective capacity for correcting for a change in the residual capacity due to a degradation of the battery or an integration error corrective capacity for correcting for an integration error of the discharge current at every predetermined period from said battery, when the residual capacity of said battery is virtually zero, and correcting the residual capacity of said battery which has been calculated based on the initial value of the residual capacity of the battery and the discharge current at every predetermined period from said battery, with said degradation error corrective capacity or said integration error corrective capacity, for thereby calculating the residual capacity of said battery while the battery is being discharged.

According to the present invention, the above object can also be achieved by a method of detecting the residual capacity of a battery for energizing an electric motor to propel an electric vehicle while the battery is being discharged, based on an initial value of the residual capacity of the battery upon a transition of the battery from another condition to a discharging condition and a discharge current at every predetermined period from said battery after said transition, said method comprising the steps of detecting a battery voltage at every predetermined period while the battery is being discharged, determining whether the detected battery voltage while the battery is being discharged is lower than a preset value or not, determining the residual capacity of the battery as being virtually zero when the detected battery voltage while the battery is being discharged is determined as being lower than said preset value, to calculate a degradation error corrective capacity for correcting for a change in the residual capacity due to a degradation of the battery or an integration error corrective capacity for correcting for an integration error of the discharge current at every predetermined period from said battery, and correcting the residual capacity of said battery which has been calculated based on the initial value of the residual capacity of the battery and the discharge current at every predetermined period from said battery, with said degradation error corrective capacity or said integration error corrective capacity, for thereby calculating the residual capacity of said battery while the battery is being discharged.

According to the present invention, the above object can further be achieved by a method of detecting the residual capacity of a battery for energizing an electric motor to propel an electric vehicle upon a transition of the battery from another condition to a discharging condition, comprising the steps of detecting a residual capacity of the battery based on a battery voltage at the time the battery starts being charged, and calculating a required charge quantity from the detected residual capacity and a stored rated capacity of the battery, detecting a battery temperature, and determining a temperature corrective coefficient to correct said required charge quantity with the battery temperature, based on said battery temperature, calculating a target charge quantity at said battery temperature from said required charge quantity and said temperature corrective coefficient, determining a charging efficiency representative of a proportion of a charging current which is converted into a residual capacity, of a charging current which is supplied to the battery, based on the battery voltage while the battery is being charged, and determining an actual charge quantity from an integrated charge quantity indicative of an integrated average charging current at every predetermined period and said charging efficiency.

According to the present invention, the above object can also be achieved by a method of detecting the residual capacity of a battery for energizing an electric motor to propel an electric vehicle when the battery is left to stand after the battery has been either charged or discharged, comprising the steps of detecting a first battery voltage immediately after the battery is left to stand and a second battery voltage upon elapse of a predetermined time after the battery is left to stand, and calculating the difference between said first battery voltage and said second battery voltage, determining whether the battery has been in a charging condition or a discharging condition immediately before the battery is left to stand, based on said calculated difference, reading a third battery voltage corresponding to said second battery voltage from first memory means which stores said third battery voltage which is expected to be in a stable state of the battery voltage in a manner to correspond to said second battery voltage, when the battery is determined as having been in the charging condition, and reading a residual capacity of the battery corresponding to the read third battery voltage from second memory means which stores said residual capacity in a manner to correspond to said third battery voltage.

According to the present invention, the above object can also be achieved by a method of detecting the residual capacity of a battery for energizing an electric motor to propel an electric vehicle when the battery is left to stand after the battery has been either charged or discharged, comprising the steps of detecting a first battery voltage immediately after the battery is left to stand and a second battery voltage upon elapse of a predetermined time after the battery is left to stand, and calculating the difference between said first battery voltage and said second battery voltage, determining whether the battery has been in a charging condition or a discharging condition immediately before the battery is left to stand, based on said calculated difference, and reading a residual capacity of the battery corresponding to said second battery voltage from memory means which stores said residual capacity in a manner to correspond to said second battery voltage, when the battery is determined as having been in the discharging condition.

Generally, the voltage of a battery on an electric vehicle increases immediately after the battery is discharged. If a residual capacity of the battery were calculated based on the increased battery voltage, then the residual capacity of the battery would become inaccurate, possibly introducing a problem at the time the electric vehicle starts to run.

According to the present invention, a residual capacity of the battery is determined on the basis of a battery voltage which is expected to be in a stable state established after elapse of a sufficient period of time. Therefore, the residual capacity of the battery can be determined highly accurately.

The above and other objects, features, and advantages of the present invention will become apparent from the following description when taken in conjunction with the accompanying drawings which illustrate a preferred embodiment of the present invention by way of example.

BRIEF DESCRIPTION OF THE DRAWINGS

FIG. 19 is a graph illustrative of how the voltage across the batteries varies with respect to the time in which the batteries are left to stand;

DETAILED DESCRIPTION OF THE PREFERRED EMBODIMENT

Figure 1:
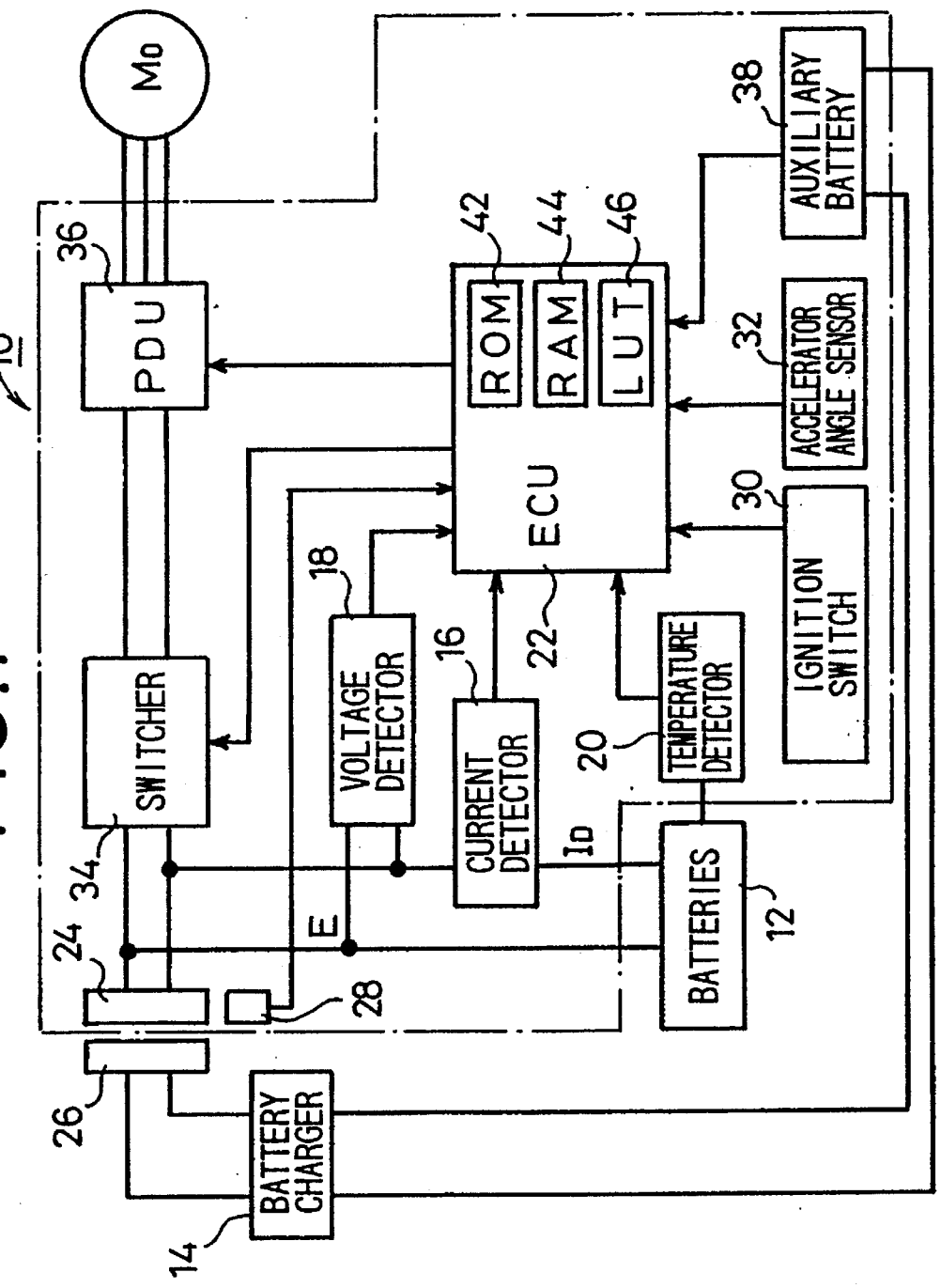
FIG. 1 is a block diagram of an apparatus for displaying the residual capacity of a battery for use on an electric vehicle.

As shown in FIG. 1, an apparatus 10 for displaying the residual capacity of a battery for use on an electric vehicle is associated with a plurality of series-connected batteries 12, and an electric motor Mo energizable by the batteries 12. A battery charger 14 can be connected at a desired time to the batteries 12.

The apparatus 10 has a current detector 16 for detecting discharge currents supplied from the batteries 12 to the motor Mo and other electric accessories and a charging current Ic supplied from the battery charger 14 to the batteries 12, a voltage detector 18 for detecting a voltage (battery voltage) E across the batteries 12, a temperature detector 20 for detecting the temperature of the batteries, e.g., the temperature of the electrolytic solution thereof, and an electronic control unit (ECU) 22 for calculating a residual capacity C of the batteries 12 based on detected data outputted from the current detector 16, the voltage detector 18, and the temperature detector 20.

The apparatus 10 also includes a charging connector 24 which can be joined to a charging connector 26 that is electrically connectable to the battery charger 14. The apparatus 10 also includes a connection sensor 28 for detecting whether the charging connector 26 is joined to the charging connector 24, an ignition switch 30, and an accelerator angle sensor 32 for detecting the angle through which an accelerator pedal is depressed. The ignition switch 30, which is so referred to after the ignition switch of an internal combustion engine, indicates the supply of electric energy to the motor Mo when an ignition key inserted into the ignition switch 30 is turned to a start position to start the motor Mo. The apparatus 10 also has a switcher 34 connected between junctions with the batteries 12 and the motor Mo, and a power drive unit (PDU) 36 for driving the motor Mo. The ECU 22 is energized by electric energy supplied from an auxiliary battery 38.

The ECU 22 has a read-only memory (ROM) 42 which stores a program for calculating the residual capacity C of the batteries 12, a random-access memory (RAM) 44 for temporarily storing data when the ECU 22 calculates the residual capacity C of the batteries 12, and a look-up table (LUT) memory 46 which is read by the ECU 22 when it calculates the residual capacity C of the batteries 12.

Figure 2:
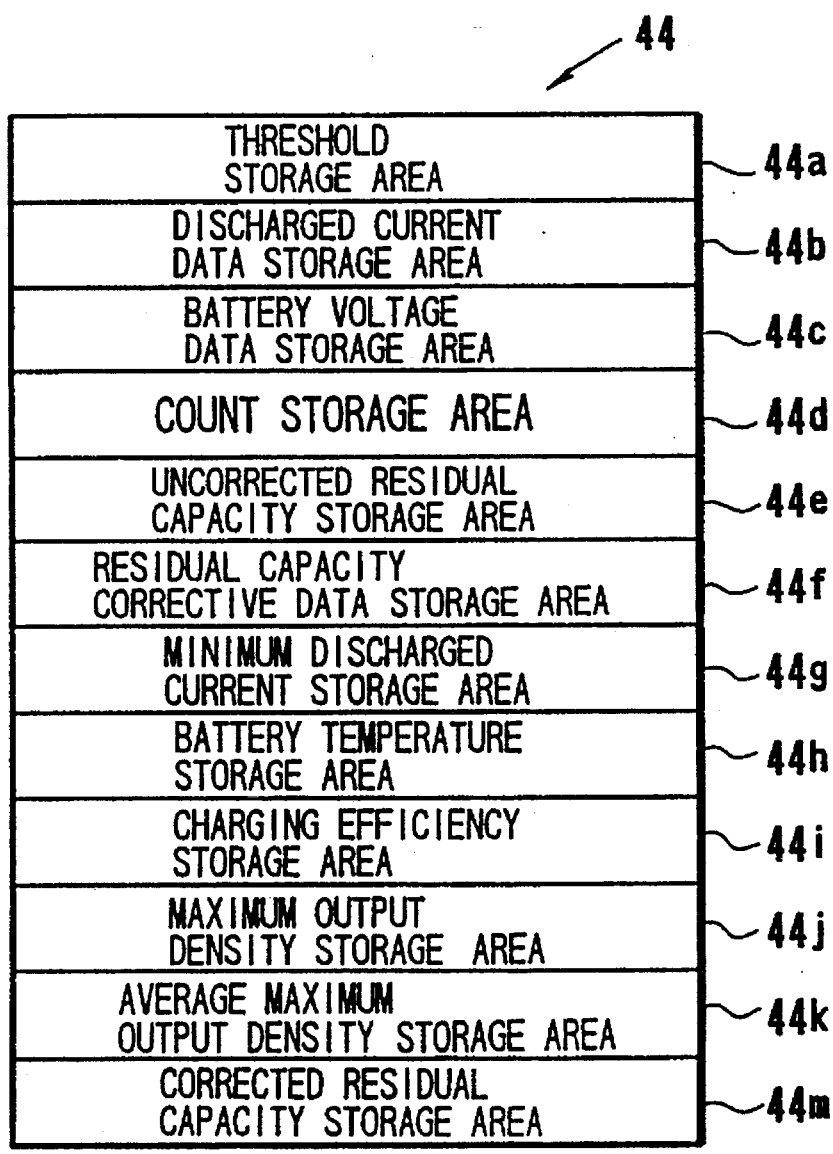
FIG. 2 is a diagram showing storage areas of a RAM in the apparatus shown in FIG. 1.

FIG. 2 shows storage areas of the RAM 44.

As shown in FIG. 2, the RAM 44 includes a threshold storage area 44a for storing thresholds that are read when data is determined by the ECU 22, a discharge current data storage area 44b for temporarily storing a discharge current $I_D$ that is read by the ECU 22 through the current detector 16, a battery voltage data storage area 44c for temporarily storing a battery voltage E that is read by the ECU 22 through the voltage detector 18, a count storage unit 44d for storing the number of times that the battery voltage E detected by the voltage detector 18 is lower than a threshold $E_1$ stored in the threshold storage area 44a in a discharge mode, an uncorrected residual capacity storage area 44e for storing an uncorrected residual capacity $C_t$, and a residual capacity corrective data storage area 44f for storing calculated data of a temperature corrective capacity $C_T$, a current corrective capacity $C_D$, a degradation corrective capacity $C_R$, and a temporary corrective capacity $C_{TM}$ for correcting the uncorrected residual capacity $C_t$ stored in the uncorrected residual capacity storage area 44e.

The RAM 44 also includes a minimum discharge current storage area 44g for storing a minimum discharge current $I_{min}$ of those discharge currents $I_D$ which are discharged when the battery voltage E is lower than the threshold $E_1$, a battery temperature storage area 44h for storing the battery temperature T detected by the temperature detector 20, a charging efficiency storage area 44i for storing a charging efficiency M determined by the ECU 22, a maximum output density storage area 44j for storing a maximum output density that is calculated by dividing the maximum output that can be produced from the batteries 12 by the weight of the batteries 12, an average maximum output density storage area 44k for storing an average maximum output density which represents an average value of a certain number of maximum output densities, and a corrected residual capacity storage area 44m for storing a corrected residual capacity $C_r$ which is calculated by correcting the uncorrected residual capacity $C_t$ with various corrective values.

FIGS. 3A and 3B through 5B show data of look-up tables stored in the LUT memory 46.

Figure 3A:
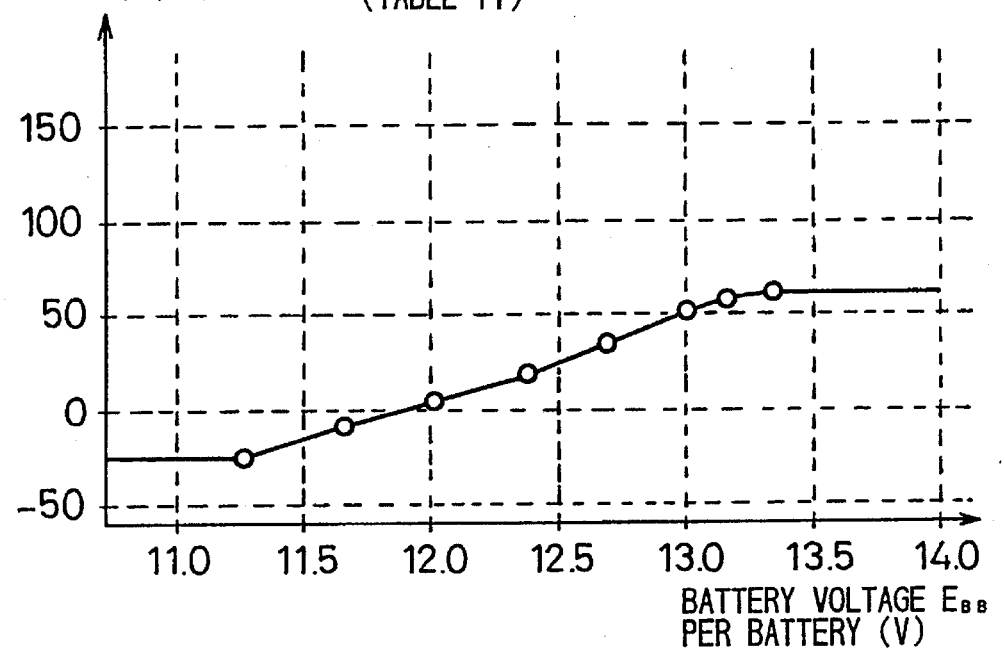
FIG. 3A is a graph showing a look-up table stored in an LUT memory in the apparatus shown in FIG. 1, which represents the relationship between the voltage per battery and the residual capacity of batteries.
Figure 3B:
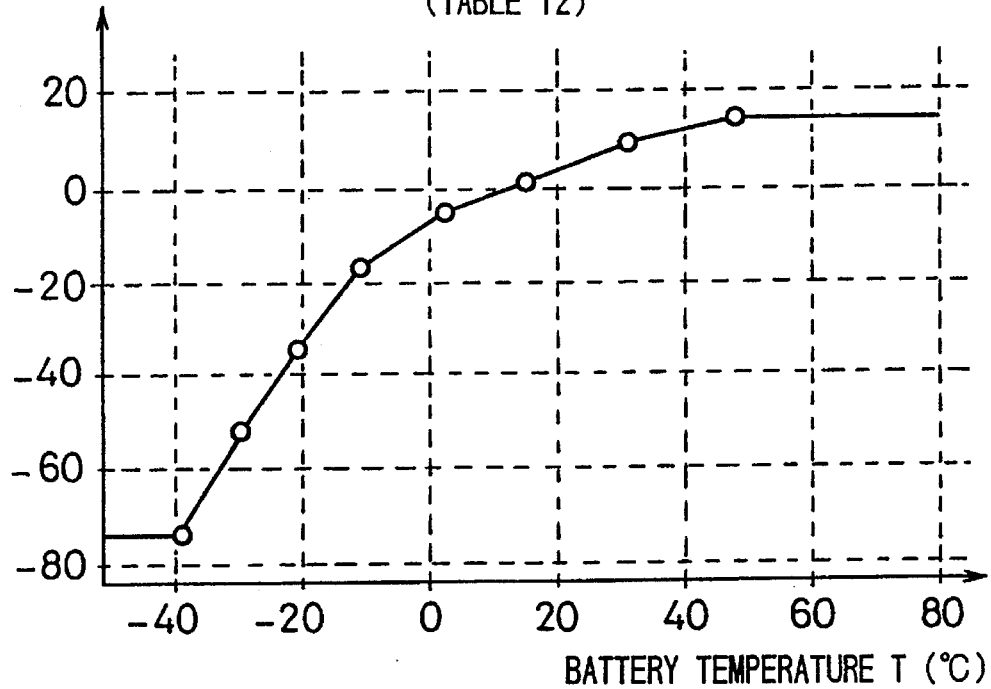
FIG. 3B is a graph showing a look-up table stored in the LUT memory which represents the relationship between the temperature of the batteries and the temperature corrective capacity.

FIG. 3A shows a look-up table T1 from which to read the uncorrected residual capacity $C_t$ of the batteries 12 based on the battery voltage $E_{BB}$ per battery. FIG. 3B shows a look-up table T2 from which to read a corrective value (temperature corrective capacity $C_T$) for correcting a temperature-dependent change in the uncorrected residual capacity $C_t$ of the batteries 12 based on the battery temperature T detected by the temperature detector 20.

Figure 4A:
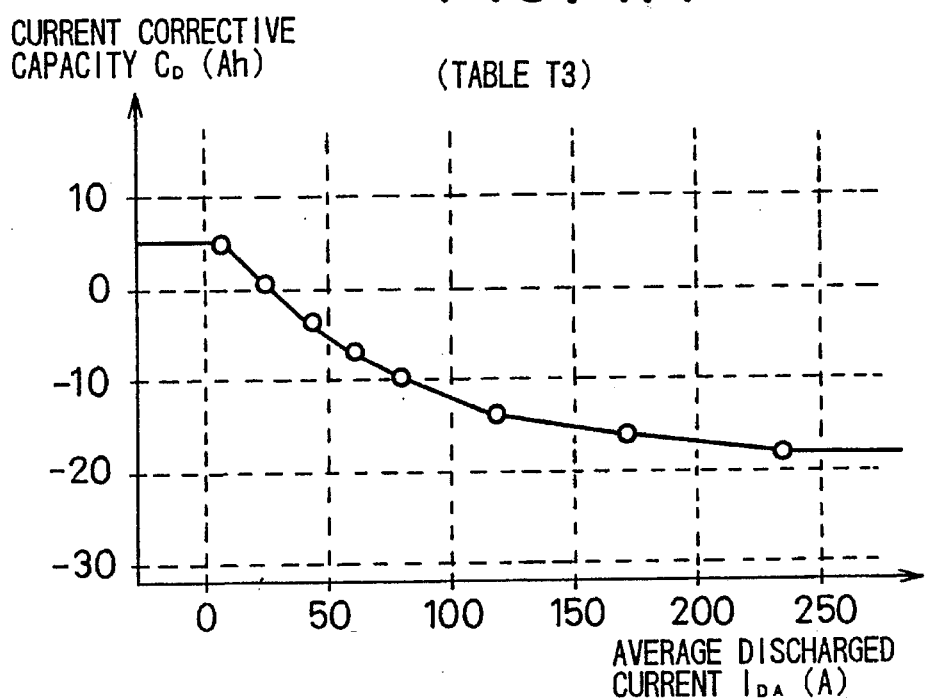
FIG. 4A is a graph showing a look-up table stored in the LUT memory which represents the relationship between the average discharge current in one minute and the current corrective capacity.
Figure 4B:
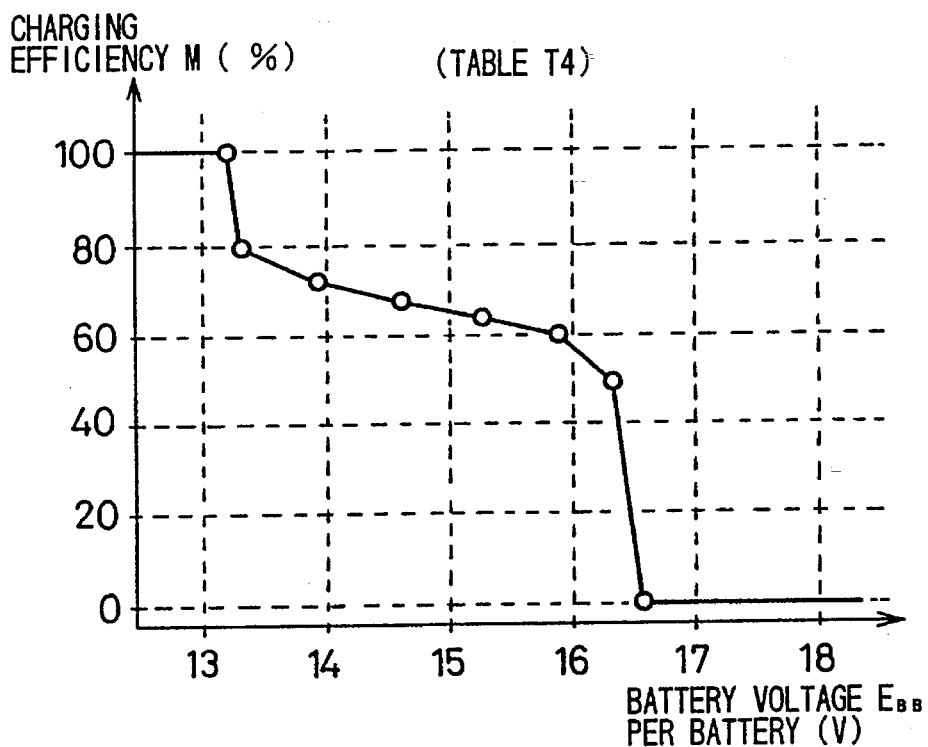
FIG. 4B is a graph showing a look-up table stored in the LUT memory which represents the relationship between the voltage per battery and the charging efficiency.

FIG. 4A shows a look-up table T3 from which to read a corrective value (current corrective value $C_D$) for correcting the uncorrected residual capacity $C_t$ of the batteries 12 based on an average discharge current $I_{DA}$ in one minute. FIG. 4B shows a look-up table T4 from which to read the proportion (charging efficiency M) of a current which is converted into the uncorrected residual capacity $C_t$ in the batteries 12, of a supplied charging current $I_c$ based on the battery voltage $E_{BB}$, in a charge mode in which the charging current $I_C$ is supplied from the battery charger 14 to the batteries 12.

Figure 5A:
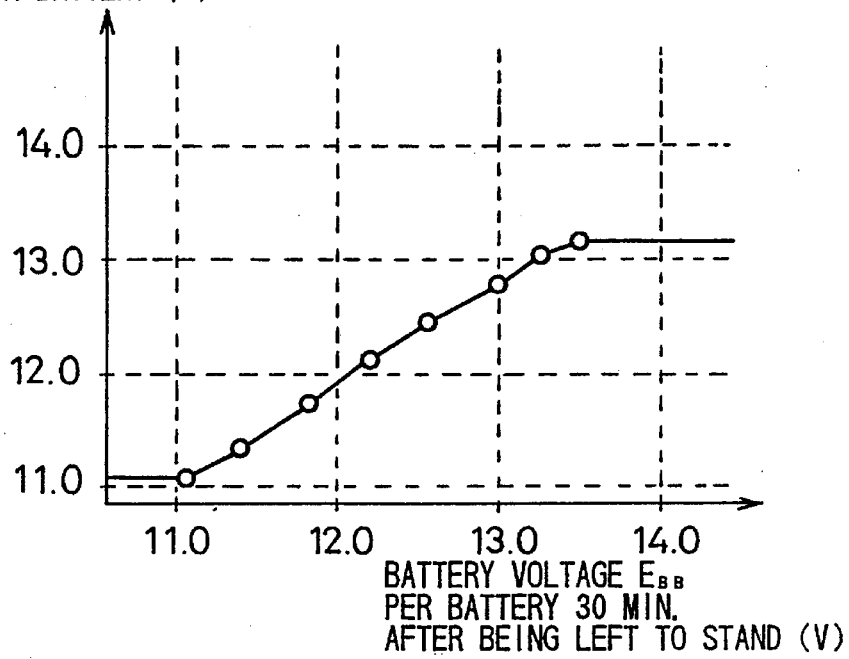
FIG. 5A is a graph showing a look-up table stored in the LUT memory which represents the relationship between the voltage per battery 30 minutes after the battery has been left to stand and the voltage per battery which is predicted when the battery is stable.
Figure 5B:
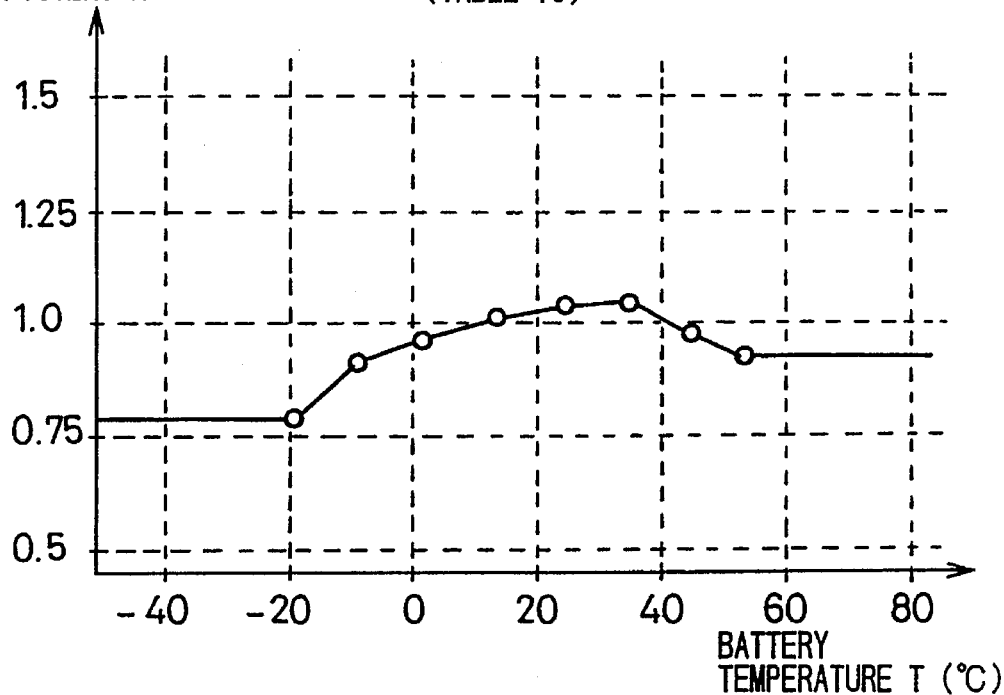
FIG. 5B is a graph showing a look-up table stored in the LUT memory which represents the relationship between the battery temperature and the temperature corrective coefficient.

FIG. 5A shows a look-up table T5 from which to read a stable battery voltage $E_{BB}$ predicted after elapse of a given period of time, based on the battery voltage $E_{BB}$ after the battery has been left to stand for 30 minutes. FIG. 5B is a look-up table T6 from which to read a temperature corrective coefficient X of a charging rate Y based on the battery temperature T. The charging rate Y represents the difference between the rated capacity $C_F$ and the present corrected residual capacity $C_r$ of the batteries 12.

A process of detecting and displaying the corrected residual capacity $C_r$ of the batteries 12 in the discharge mode in which currents are supplied from the batteries 12 to the motor Mo and the electric accessories including an air-conditioning unit on the electric vehicle will be described below with reference to FIG. 6.

When an ignition key inserted in the ignition switch 30 is turned to a position to start the motor Mo by the driver, the ECU 22 determines that the batteries 12 are in the discharge mode based on a signal outputted from the ignition switch 30 in a step S10. The ECU 22 applies a signal to the switcher 34 to connect the batteries 12 and the PDU 36 to each other. The ECU 22 also applies a motor drive signal to the PDU 36, allowing a battery voltage E to be applied through the switcher 34 and the PDU 36 to the motor Mo, which starts rotating.

When the motor Mo starts rotating, the battery voltage E detected by the voltage detector 18 is sampled at predetermined sampling times, e.g., a period of 100 msec., and the sampled battery voltage E is read every minute by the ECU 22 in a step S12. Specifically, 600 data per minute of the battery voltage E are read by the ECU 22, and stored in the battery voltage data storage area 44c of the RAM 44. At the same time, a discharge current $I_D$ supplied from the batteries 12 to the motor Mo and detected by the current detector 16 is sampled at predetermined sampling times, e.g., a period of 100 msec., and 600 data per minute of the discharge current $I_D$ are read by the ECU 22, and stored in the discharge current data storage area 44b of the RAM 44 in the step S12.

Then, the ECU 22 calculates an average battery voltage $E_A$ of the 600 data per minute of the battery voltage E which are stored in the battery voltage data storage area 44c, and calculates a battery voltage $E_{BB}$ per battery. Based on the calculated battery voltage $E_{BB}$, the ECU 22 reads an initial value of the uncorrected residual capacity $C_t$ of the batteries 12 in the discharge mode from the look-up table T1 stored in the LUT memory 46, and stores the read initial value in the uncorrected residual capacity storage area 44e in a step S14.

The ECU 22 counts those battery voltages E of the 600 data which are lower than the first threshold $E_1$ stored in the threshold storage area 44a, and stores the count in the count storage area 44d in a step S16. The ECU 22 also extracts discharge currents $I_D$ when those battery voltages E are lower than the first threshold $E_1$, and extracts a minimum discharge current $I_{min}$ of the extracted discharge current $I_D$ in a step S18. The ECU 22 stores the extracted minimum discharge current $I_{min}$ in the minimum discharge current storage area 44g.

Figure 7:
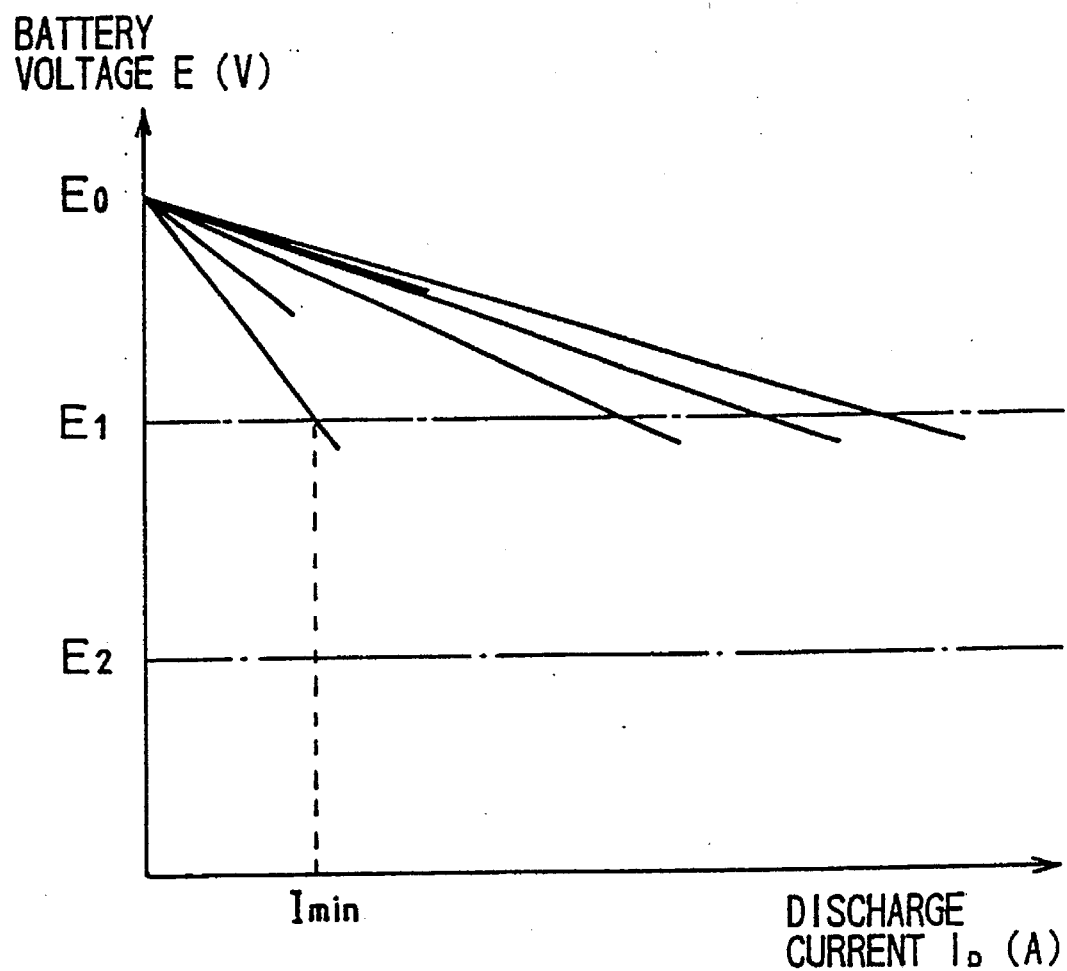
FIG. 7 is a diagram showing the relationship between the discharge current and the voltage across the batteries which are being discharged in the discharge mode.

As shown in FIG. 7, the battery voltage E varies depending on the discharge current $I_D$ such that the battery voltage E of a more degraded battery 12 drops to a larger degree with a smaller discharge current $I_D$.

Then, the ECU 22 reads the 600 data of the discharge current $I_D$ read in the step S12 and stored in the discharge current data storage area 44b, adds the 600 data, calculates an average discharge current $I_{DA}$ for one minute from the added 600 data of the discharge current $I_D$ in a step S20. The ECU 22 integrates the average discharge current $I_{DA}$, thereby producing a discharge quantity ΔC for one minute of electric energy for one minute in a step S22.

The ECU 22 subtracts the discharge quantity ΔC for one minute from the initial value of the uncorrected residual capacity $C_t$, and updates the uncorrected residual capacity $C_t$ stored in the uncorrected residual capacity storage area 44e into the uncorrected residual capacity $C_t$ from which the discharge quantity ΔC for one minute has been subtracted according to the following equation (1) in a step S24:

$$C_t \leftarrow C_t - \Delta C. \tag{1}$$

The ECU 22 thus updates the uncorrected residual capacity $C_t$ every minute. The ECU 22 determines whether or not the updated uncorrected-residual capacity $C_t$ is equal to or smaller than a minimum residual capacity $C_{min}$ stored in the threshold storage area 44a in a step S26. If the updated uncorrected residual capacity $C_t$ is equal to or smaller than the minimum residual capacity $C_{min}$, then the ECU 22 updates the uncorrected residual capacity $C_t$ stored in the uncorrected residual capacity storage area 44e into the minimum residual capacity $C_{min}$ in a step S28.

If the updated uncorrected residual capacity $C_t$ is neither equal to nor smaller than the minimum residual capacity $C_{min}$, then the ECU 22 determines whether or not the updated uncorrected residual capacity $C_t$ is equal to or greater than a maximum residual capacity $C_{max}$ stored in the threshold storage area 44a in a step S30. If the updated uncorrected residual capacity $C_t$ is equal to or greater than the maximum residual capacity $C_{max}$, then the ECU 22 updates the uncorrected residual capacity $C_t$ stored in the uncorrected residual capacity storage area 44e into the maximum residual capacity $C_{max}$ in a step S32.

The ECU 22 reads a battery temperature T detected by the temperature detector 20, reads a temperature-dependent corrective value (temperature corrective capacity $C_T$) for correcting the uncorrected residual capacity $C_t$ from the look-up table T2 stored in the LUT memory 46, and stores the read temperature corrective capacity $C_T$ in the residual capacity corrective data storage area 44f in a step S34.

Based on the average discharge current $I_{DA}$ calculated in the step S20, the ECU 22 reads a corrective value (current corrective value $C_D$) for correcting the uncorrected residual capacity $C_t$ from the look-up table T3 stored in the LUT memory 46, and stores the read current corrective value $C_D$ in the residual capacity corrective data storage area 44f in a step S36.

Based on a corrective value (degradation corrective capacity $C_R$) for correcting a degradation-dependent variation in a rated capacity $C_{F1}$ of the batteries 12 and an integrated value of discharge quantities ΔC, the ECU 22 calculates a corrective value (temporary corrective capacity $C_{TM}$) for correcting an error of the residual capacity C which is produced due to an integration error of the discharge quantities ΔC when the residual capacity C is calculated, according to a degradation corrective capacity calculating subroutine (described later on), and stores the calculated temporary corrective capacity $C_{TM}$ in the residual capacity corrective data storage area 44f in a step S38. The temporary corrective capacity $C_{TM}$ is also used when charging currents $I_c$ are integrated to calculate an uncorrected residual capacity $C_t$ in a charge mode.

The ECU 22 corrects the uncorrected residual capacity $C_t$ with the temperature corrective capacity $C_T$, the current corrective value $C_D$, the degradation corrective capacity $C_R$, and the temporary corrective capacity $C_{TM}$, thereby calculating a corrected residual capacity $C_r$ according to the equation (2), given below, in a step S40.

$$C_r \leftarrow C_t + C_T + C_D - C_R - C_{TM}. \tag{2}$$

The degradation corrective capacity calculating subroutine in the step S38 will be described below with reference to FIGS. 8 through 12.

Figure 8:
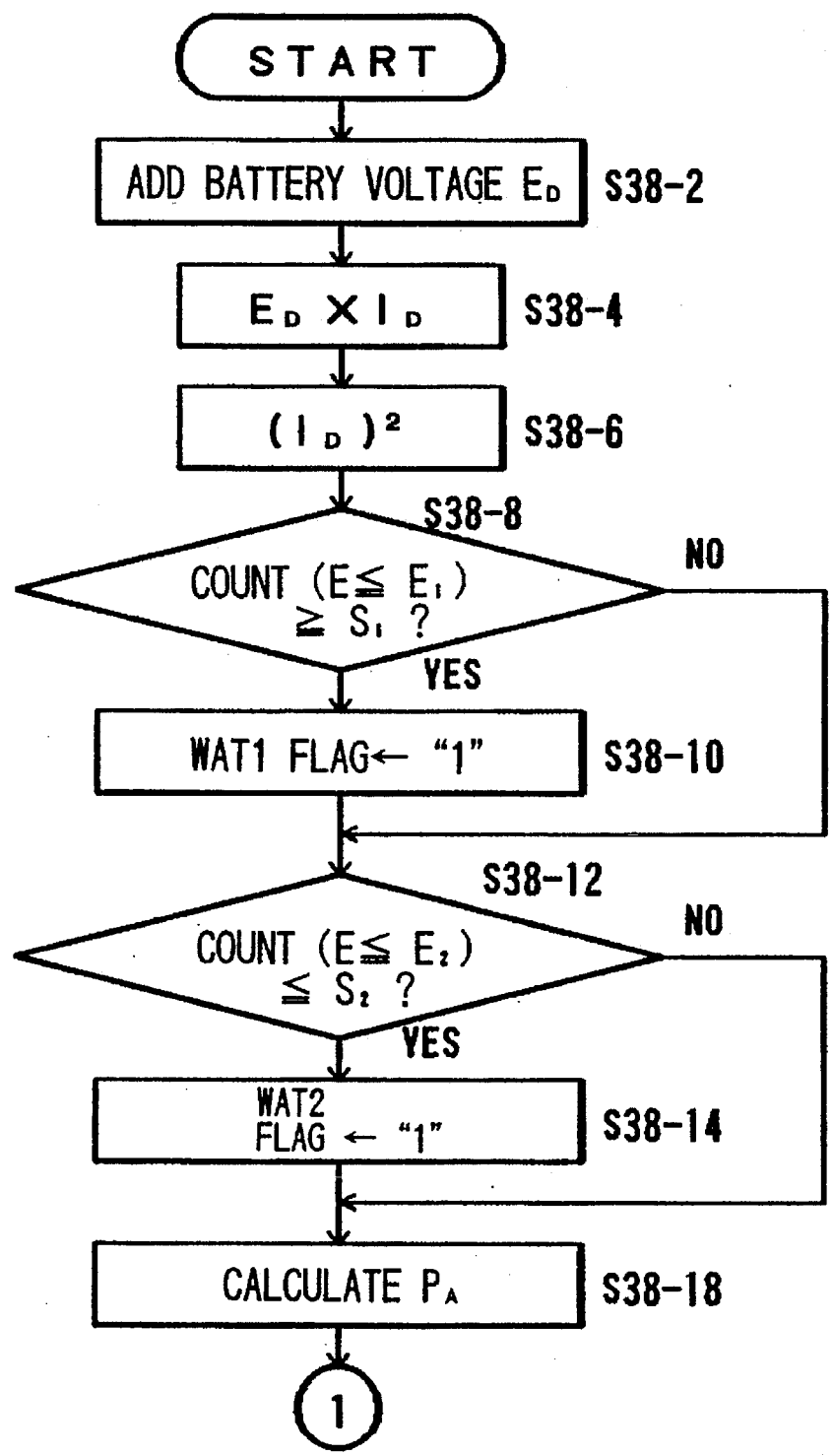
FIGS. 8 through 12 are flowcharts of a subroutine for calculating a degradation corrective value in the main flowchart shown in FIG. 6.

As shown in FIG. 8, the ECU 22 adds the 600 data of the battery voltage E read in the step S12 and stored in the battery voltage data storage area 44c, thereby determining a sum battery voltage $E_D$ in a step S38-2. The ECU 22 multiplies the sum battery voltage $E_D$ by the sum of the added 600 data of the discharge current $I_D$ (sum discharge current $I_D$) from the step S20 ($E_D \times I_D$) in a step S38-4. The ECU 22 squares the sum of the added 600 data of the discharge current $I_D$ in a step S38-6.

The ECU 22 determines whether or not the count determined in the step S16 is equal to or greater than a predetermined value $S_1$ in a step S38-8. If the count is equal to or greater than the predetermined value $S_1$, then the ECU 22 sets a WAT1 flag to "1" in a step S38-10. The ECU 22 also determines whether or not the count or the number of those battery voltages E of the 600 data, read in one minute in the step S12, which are lower than a second threshold $E_2$ stored in the threshold storage area 44a, is equal to or smaller than a predetermined value $S_2$ in a step S38-12. If the count is equal to or smaller than the predetermined value $S_2$, then the ECU 22 sets a WAT2 flag to "1" in a step S38-14.

If the count determined in the step S16 is neither equal to nor greater than the predetermined value $S_1$ in the step S38-8, then control jumps to the step S38-12 without setting the WAT1 flat to "1" in the step S38-10. If the count is neither equal to nor smaller than the predetermined value $S_2$ in the step S38-12, then control jumps to a step S38-18 without setting the WAT2 flat to "1" in the step S38-14.

In the step S38-18, the ECU 22 calculates an average maximum output density $P_A$.

More specifically, the ECU 22 determines a linear formula indicative of the relationship between the sum battery voltage $E_D$ and the sum discharge current $I_D$ according to a method of least squares using the sum battery $E_D$ calculated in the step S38-2, the product of the sum battery voltage $E_D$ and the sum discharge current $I_D$ calculated in the step S38-4, and the square of the sum discharge current $I_D$ calculated in the step S38-6, calculates a maximum output $P_{max}$ from the batteries 12 according to the determined linear formula, divides the maximum output $P_{max}$ by the weight of the batteries 12 into a maximum output density, and stores the maximum output density in the maximum output density storage area 44j.

The maximum output density is determined according to the linear formula: $(E_0/2) \times (I_s/2)$ where $E_0$ is the value of the battery voltage $E_D$ at the time the discharge current $I_D$ is zero and $I_S$ is the value of the discharge current $I_D$ when the battery voltage $E_D$ is zero.

The ECU 22 reads N maximum output densities, e.g., five maximum output densities, including the maximum output density, in the past from the maximum output density storage area 44j, calculates an average of the read maximum output densities as an average maximum output density $P_A$, and stores the average maximum output density $P_A$ in the average maximum output density storage area 44k.

Figure 9:
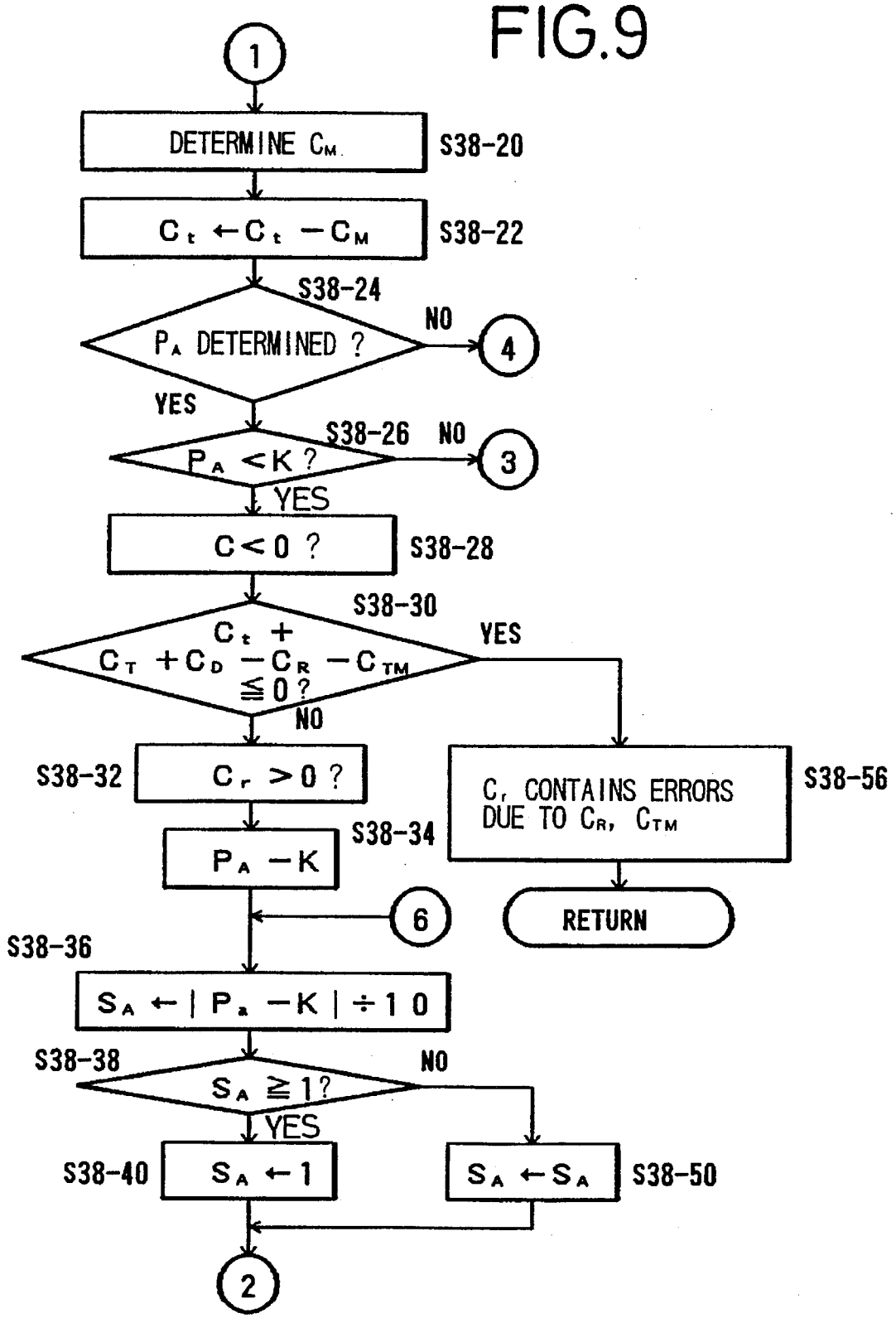
Figure 10:
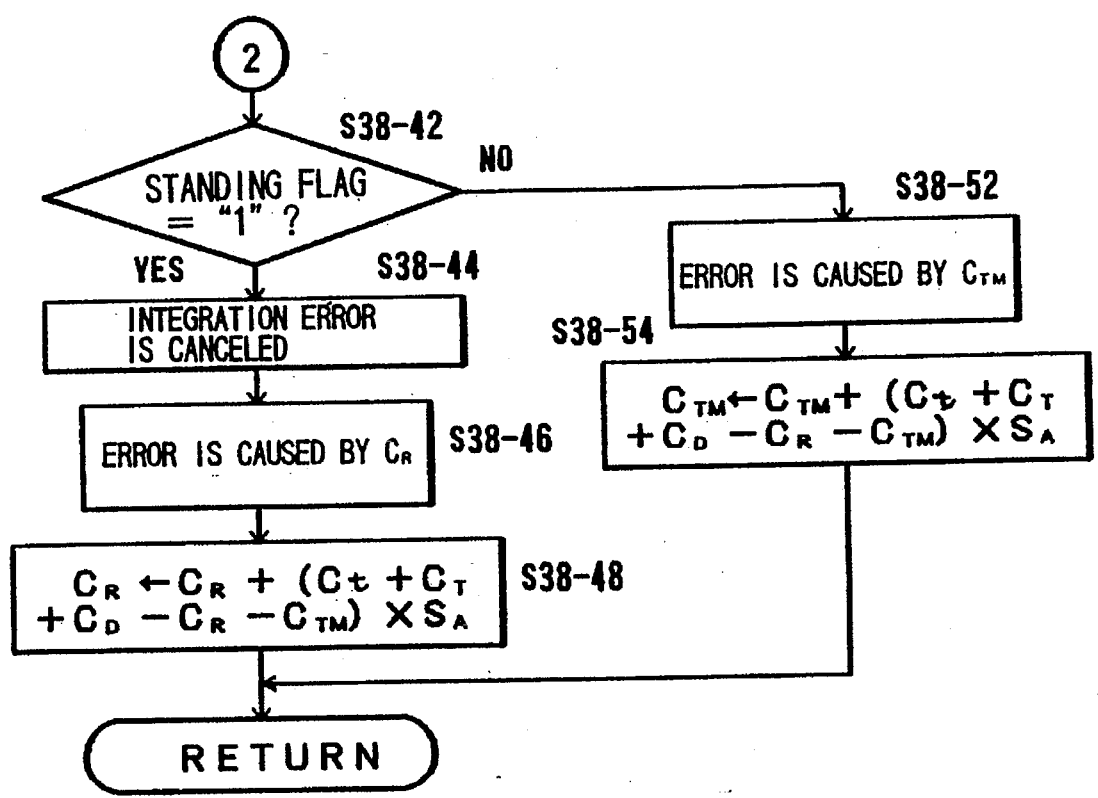

Then, as shown in FIG. 9, the ECU 22 integrates discharge quantities $\Delta C$ which are calculated in the step S22 to produce an integrated discharge capacity $C_M$ in a step S38-20. The ECU 22 subtracts the integrated discharge capacity $C_M$ from the initial value of the uncorrected residual capacity $C_t$ which is determined and stored in the uncorrected residual capacity storage area 44e, thus determining an uncorrected residual capacity $C_t$ which is stored in the uncorrected residual capacity storage area 44e in a step S38-22.

Thereafter, the ECU 22 determines whether an average maximum output density $P_A$ has been determined or not in a step S38-24. If determined, then the ECU 22 determines whether or not the average maximum output density $P_A$ is smaller than a threshold K that is stored in the threshold storage area 44a in a step S38-26. The threshold K serves to determine whether the virtual residual capacity C of the batteries 12 is "0" or not. If the average maximum output density $P_A$ is smaller than the threshold K in the step S38-26, then the ECU 22 determines that the residual capacity C of the batteries 12 is essentially "0" in a step S38-28.

Then, the ECU 22 determines whether or not the corrected residual capacity $C_r$, which has been produced by correcting the uncorrected residual capacity $C_t$ from the step S38-22 with the temperature corrective capacity $C_T$, the current corrective value $C_D$, the degradation corrective capacity $C_R$, and the temporary corrective capacity $C_{TM}$, is equal to or smaller than "0" according to the following formula (3) in a step S38-30:

$$C_t + C_T + C_D - C_R - C_{TM} \leq 0. \qquad (3)$$

The values of the degradation corrective capacity $C_R$ and the temporary corrective capacity $C_{TM}$ which are used in the calculation of the formula (3) are values in a previous cycle which are stored in the residual capacity corrective data storage area 44f.

If the corrected residual capacity $C_r$ is neither equal to nor smaller than "0" in the step S38-30, then the ECU 22 determines that the corrected residual capacity $C_r$ is greater than "0" in a step S38-32. At this time, even though the virtual residual capacity C has been determined as being greater than "0" based on the average maximum output density $P_A$ in the step S38-28, the corrected residual capacity $C_r$ produced by integrating discharge quantities $\Delta C$ is determined as being greater than "0".

The ECU 22 then calculates the difference between the average maximum output density $P_A$ and the threshold K in a step S38-34, calculates a degraded quantity calculating coefficient $S_A$ by dividing the calculated difference by a predetermined value, e.g., "10", in a step S38-36, and determines whether or not the degraded quantity calculating coefficient $S_A$ is equal to or greater than "1" in a step S38-38.

If the degraded quantity calculating coefficient $S_A$ is equal to or greater than "1", i.e., if the average maximum output density $P_A$ is much smaller than the threshold K, then the ECU 22 sets the degraded quantity calculating coefficient $S_A$ to a maximum value of "1" in a step S38-40. Thereafter, the ECU 22 reads a standing flag set in a standing mode in which the batteries 12 are left to stand (described later on), and determines whether the standing flag is "1" or not in a step S38-42 (see FIG. 10).

If the standing flag is "1", then the ECU 22 determines an integration error produced by the integration of discharge currents $I_D$ in the calculation of the discharge quantity $\Delta C$ in the discharge mode, as being canceled in a step S38-44. Then, the ECU 22 determines the corrected residual capacity $C_r$ produced by the integration of discharge quantities $\Delta C$ as containing an error due to degradation of the batteries 12 in a step S38-46, and calculates a degradation corrective capacity $C_R$ for the batteries 12 according to the following equation (4) in a step S38-48:

$$C_R \leftarrow C_R + (C_t + C_r + C_D - C_R - C_{TM}) \times S_A. \qquad (4)$$

The ECU 22 updates a previous degradation corrective capacity $C_R$ stored in the residual capacity corrective data storage area 44f into the calculated degradation corrective capacity $C_R$. Then, control returns to the main routine shown in FIG. 6.

If the degraded quantity calculating coefficient $S_A$ is neither equal to nor greater than "1", as determined in step S38-38, the ECU 22 sets the degraded quantity calculating coefficient $S_A$ to the value calculated in the step S38-36 in a step S38-50, and then control goes to the step S38-42.

If the standing flag is not "1" in the step S38-42, then the ECU 22 determines an integration error produced by the integration of discharge currents $I_D$ in the calculation of the discharge quantity $\Delta C$, as being not canceled, i.e., determines an error due to the temporary corrective capacity $C_{TM}$ being contained in the corrected residual capacity $C_r$ in a step S38-52, calculates the temporary corrective capacity $C_{TM}$ according to the following equation (5) in a step S38-54:

$$C_{TM} \leftarrow C_{TM} + (C_t + C_T + C_D - C_R - C_{TM}) \times S_A. \qquad (5)$$

The ECU 22 updates a previous temporary corrective capacity $C_{TM}$ stored in the residual capacity corrective data storage area 44f into the calculated temporary corrective capacity $C_{TM}$. Then, control returns to the main routine shown in FIG. 6.

As described above, when the corrected residual capacity $C_r$ is greater than "0" regardless of the fact that the average maximum output density $P_A$ is smaller than the threshold K, i.e., the virtual residual capacity C is smaller than "0", the ECU 22 determines whether an error contained in the corrected residual capacity $C_r$ is caused by the degradation corrective capacity $C_R$ or the temporary corrective capacity $C_{TM}$ by determining whether the standing flag is "1" or not, and calculates and updates the degradation corrective capacity $C_R$ or the temporary corrective capacity $C_{TM}$ based on the determined result.

The standing flag is set in the standing mode (described later on). When the standing flag is set to "1", an integration error so far is canceled.

If the corrected residual capacity $C_r$ is equal to or smaller than "0" in the step S38-30, then since the virtual residual capacity C is smaller than "0" and the corrected residual capacity $C_r$ is smaller than "0", the ECU 22 determines that the corrected residual capacity $C_r$ does not contain errors due to the degradation corrective capacity $C_R$ and the temporary corrective capacity $C_{TM}$ in a step S38-56. Thereafter, control returns to the main routine shown in FIG. 6.

Figure 11:
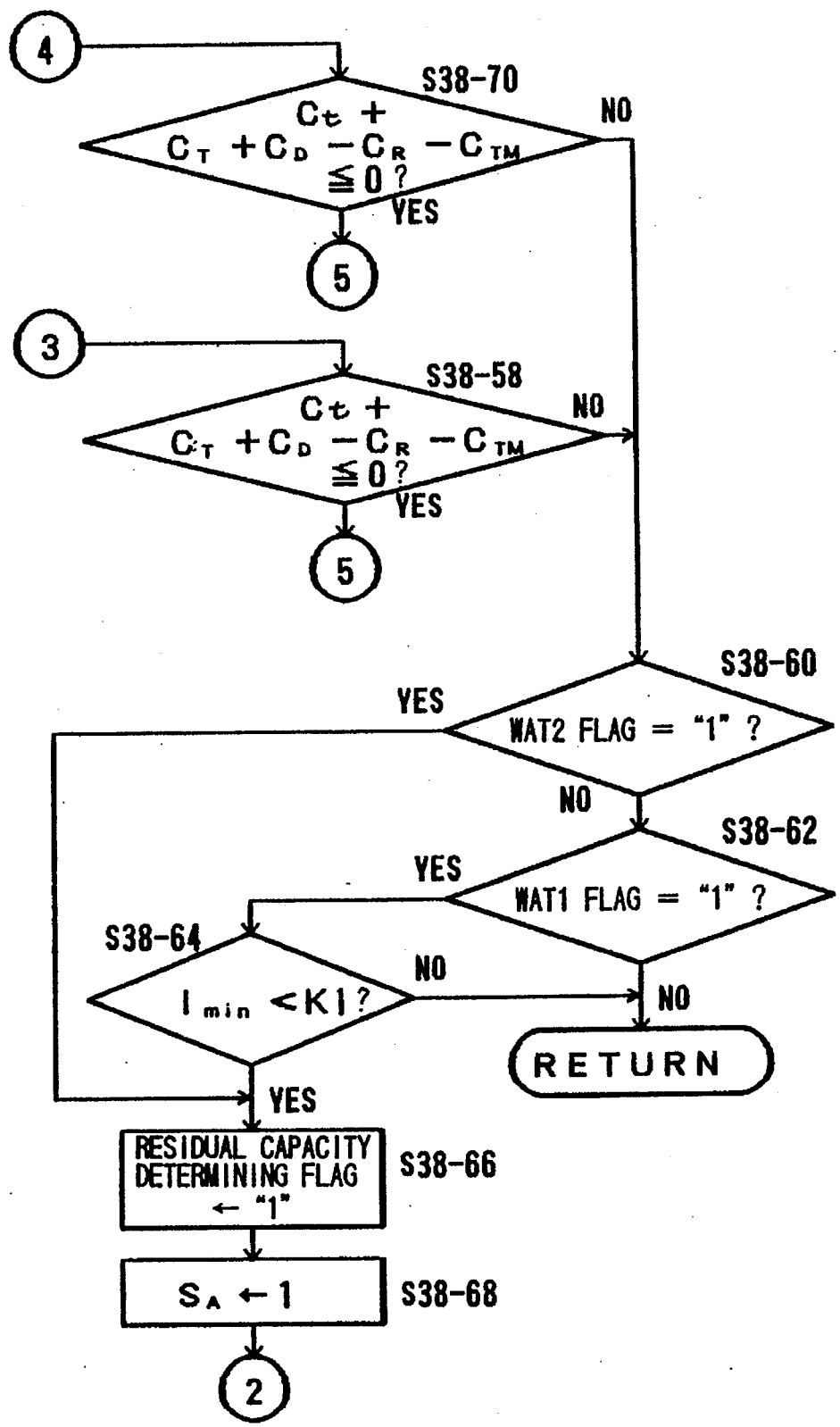

If the average maximum output density $P_A$ is not smaller than the threshold K in the step S38-26, then the ECU 22 determines whether or not the corrected residual capacity $C_r$ is equal to or smaller than "0" according to the formula (3) in a step S38-58 (see FIG. 11). If the corrected residual capacity $C_r$ is neither equal to nor smaller than "0", then the ECU 22 determines whether the WAT2 flag is "1" or not in a step S38-60. If the WAT2 flag is not "1", then the ECU 22 determines whether the WAT1 flag is "1" or not in a step S38-62. If the WAT1 flag is not "1", then the ECU 22 determines that the virtual residual capacity C is greater than "0", the corrected residual capacity $C_r$ obtained based on the integration of discharge quantities ΔC is greater than "0", and that the virtual residual capacity C and the corrected residual capacity $C_r$ obtained based on the integration of discharge quantities ΔC agree with each other, and the batteries 12 are in a normal condition in which the residual capacity C is sufficiently present. Thereafter, control returns to the main routine shown in FIG. 6.

If the WAT1 flag is "1" in the step S38-62, then the ECU 22 determines whether the minimum discharge current $I_{min}$ extracted in the step S18 is smaller than a threshold K1 for determining a reduction in the residual capacity C or not in a step S38-64. If the minimum discharge current $I_{min}$ is not smaller than the threshold K1, then the ECU 22 determines that the batteries 12 are in a normal condition in which their service life has not elapsed yet due to degradation. Thereafter, control returns to the main routine shown in FIG. 6.

If the minimum discharge current $I_{min}$ is smaller than the threshold K1, then the ECU 22 sets a residual capacity determining flag to "1" for determining whether a residual capacity is present or not in a step S38-66. Thereafter, the ECU 22 sets the degraded quantity calculating coefficient $S_A$ to a maximum value of "1" in a step S38-66, and then calculates the degradation corrective capacity $C_R$ or the temporary corrective capacity $C_{TM}$ in the steps following the step S38-42.

If the WAT2 flag is "1" in the step S38-60, then the ECU 22 determines that the residual capacity C is insufficient, and then calculates the degradation corrective capacity $C_R$ or the temporary corrective capacity $C_{TM}$ following the step S38-66.

If an average maximum output density $P_A$ has not been determined in the step S38-24, the ECU 22 determines whether or not the corrected residual capacity $C_r$ is equal to or smaller than "0" according to the formula (3) in a step S38-70. If the corrected residual capacity $C_r$ is neither equal to nor smaller than "0", then the ECU 22 determines that no average maximum output density $P_A$ has been determined, but the residual capacity C is sufficient, and executes the step S38-60 and following steps.

Figure 12:
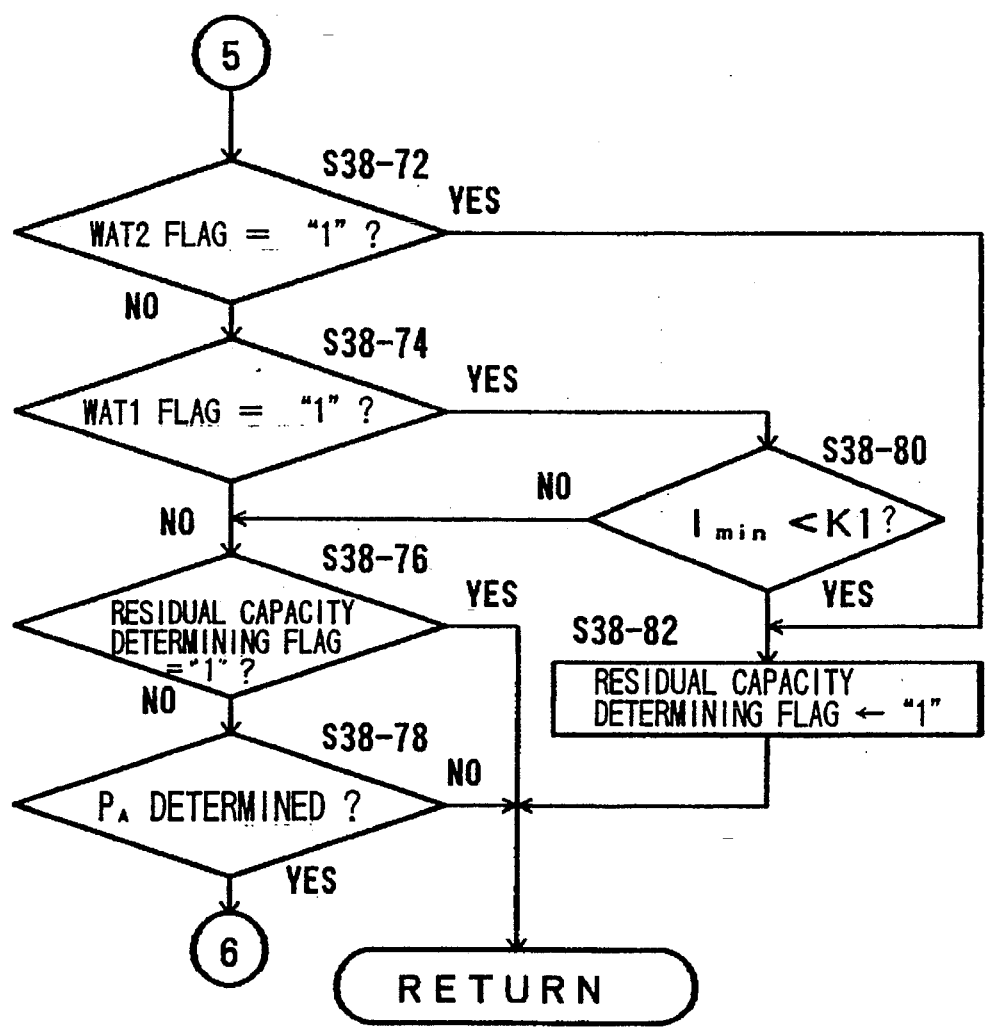

If the corrected residual capacity $C_r$ is equal to or smaller than "0" in the steps S38-58, S38-70, then the ECU 22 determines that the corrected residual capacity $C_r$ which is corrected with the temperature corrective capacity $C_T$, the current corrective value $C_D$, the degradation corrective capacity $C_R$, and the temporary corrective capacity $C_{TM}$ is smaller than "0", and determines whether the WAT2 flag is "1" or not in a step S38-72 (see FIG. 12). If the WAT2 flag is not "1", then the ECU 12 determines whether the WAT1 flag is "1" or not in a step S38-74. If the WAT1 flag is not "1", then the ECU 12 determines whether the residual capacity determining flag is "1" or not in a step S38-76. If the residual capacity determining flag is not "1", then the ECU 12 determines whether an average maximum output density $P_A$ has been determined or not in a step S38-78. If an average maximum output density $P_A$ has been determined, then the ECU 22 determines that the corrected residual capacity $C_r$ obtained based on the integration of discharge quantities ΔC is smaller than "0", but the virtual residual capacity C is greater than "0". The ECU 22 executes the step S38-36 and following steps to calculate the degradation corrective capacity $C_R$ or the temporary corrective capacity $C_{TM}$.

Figure 13:
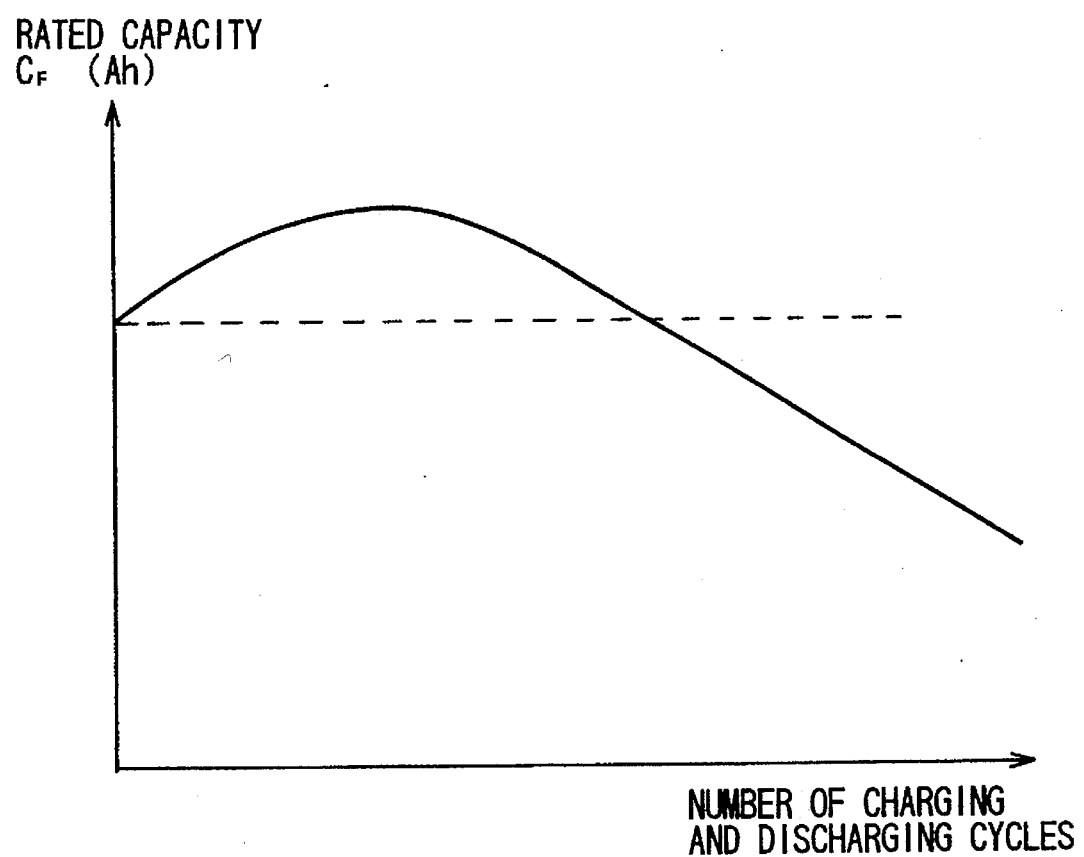
FIG. 13 is a graph illustrative of how the rated capacity of the batteries varies with respect to the number of charging and discharging cycles of the batteries.

As shown in FIG. 13, the rated capacity $C_F$ of the batteries 12 increases when the number of charging cycles increases, and then decreases after a predetermined number of charging cycles have been reached. Therefore, the degradation corrective capacity $C_R$ can be of either a positive value or a negative value with respect to the rated capacity $C_F$.

Figure 6:
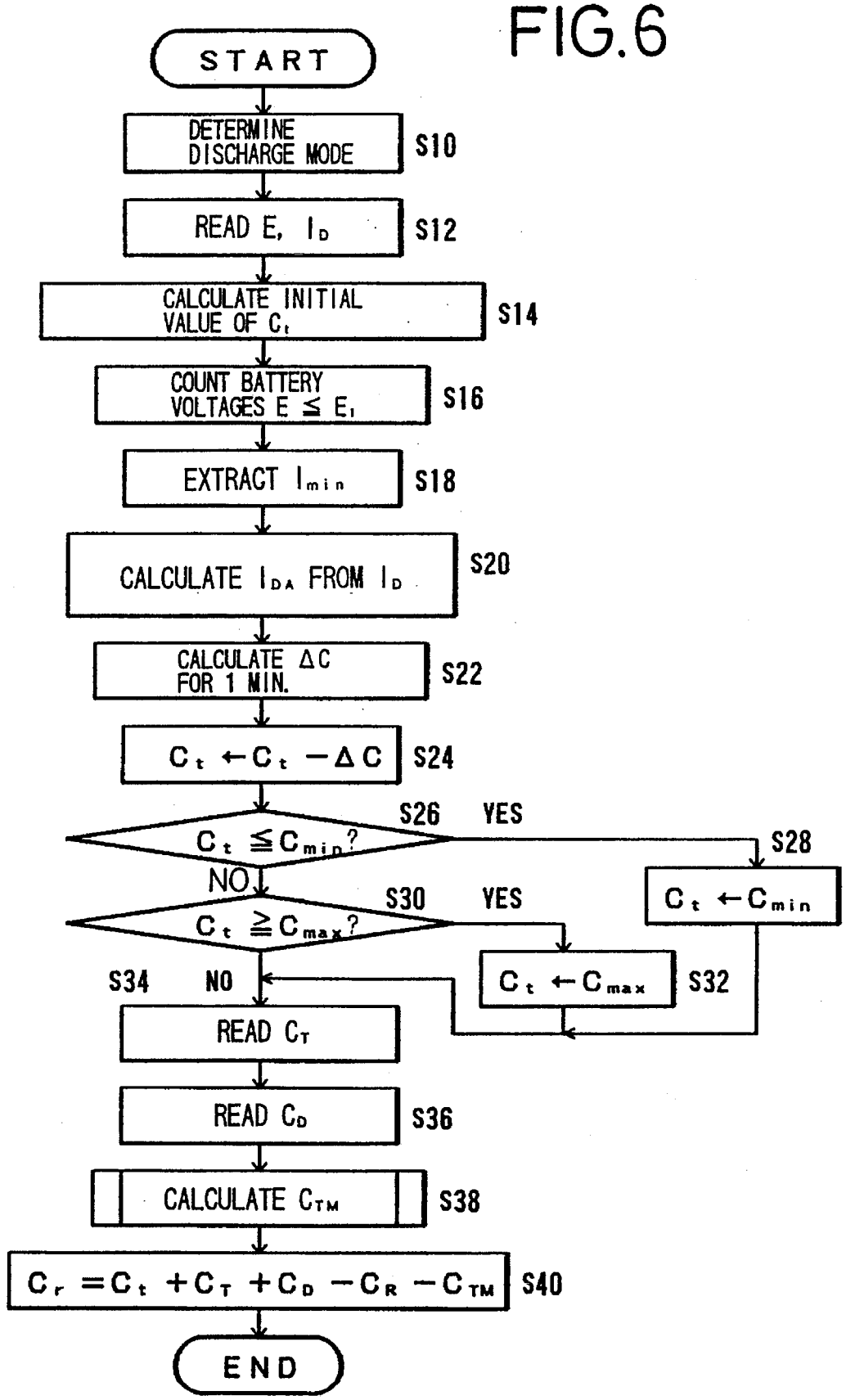
FIG. 6 is a main flowchart of a process of detecting the residual capacity of the batteries in a discharge mode.

If the residual capacity determining flag is "1" in the step S38-76, or if an average maximum output density $P_A$ has not been determined, then control returns to the main routine shown in FIG. 6.

If the WAT1 flag is "1" in the step S38-74, the ECU 22 determines whether the minimum discharge current $I_{min}$ extracted in the step S18 is smaller than the threshold K1 for determining a reduction in the residual capacity C or not in a step S38-80. If the minimum discharge current $I_{min}$ is not smaller than the threshold K1, then the ECU 22 executes the step 38-76 and following steps. If the minimum discharge current $I_{min}$ is smaller than the threshold K1, then the ECU 22 determines that the residual capacity C is smaller than "0", and sets the residual capacity determining flag to "1" in a step S38-82, and thereafter, control returns to the main routine shown in FIG. 6.

If the WAT2 flag is "1" in the step S38-72, the ECU 22 determines that the residual capacity C is smaller than "0", and sets the residual capacity determining flag to "1" in the step S38-82, and thereafter, control returns to the main routine shown in FIG. 6.

As described above, in the discharge mode, an uncorrected residual capacity $C_t$ of the batteries is calculated every minute from an initial value of the uncorrected residual capacity $C_t$ and an integrated value of discharge quantities ΔC for one minute, and a corrected residual capacity $C_r$ can be obtained highly accurately by correcting the uncorrected residual capacity $C_t$ with the temperature corrective capacity $C_T$, the current corrective value $C_D$, the degradation corrective capacity $C_R$, and the temporary corrective capacity $C_{TM}$.

When the calculated average maximum output density $P_A$ is smaller than the threshold K, which means a virtual residual capacity of "0", then, ECU 22 determines whether a corrected residual capacity $C_r$ is greater than "0" or not. If the corrected residual capacity $C_r$ is determined to be greater than "0", then, ECU 22 determines the error between the virtual residual capacity C and the corrected residual capacity $C_r$ has been brought by which of the degradation corrective capacity $C_R$ or the temporally corrective capacity $C_{TM}$, based on the content of the standing flag. ECU 22 calculates the degradation corrective capacity $C_R$ or the temporally corrective capacity $C_{TM}$ and can obtain the corrected residual capacity $C_r$ at a high accuracy based on the corrective capacity $C_R$ or $C_{TM}$.

The virtual residual capacity may be determined to be "0" when the battery voltage while the batteries are being discharged is detected to be lower than a preset value.

Figure 14:
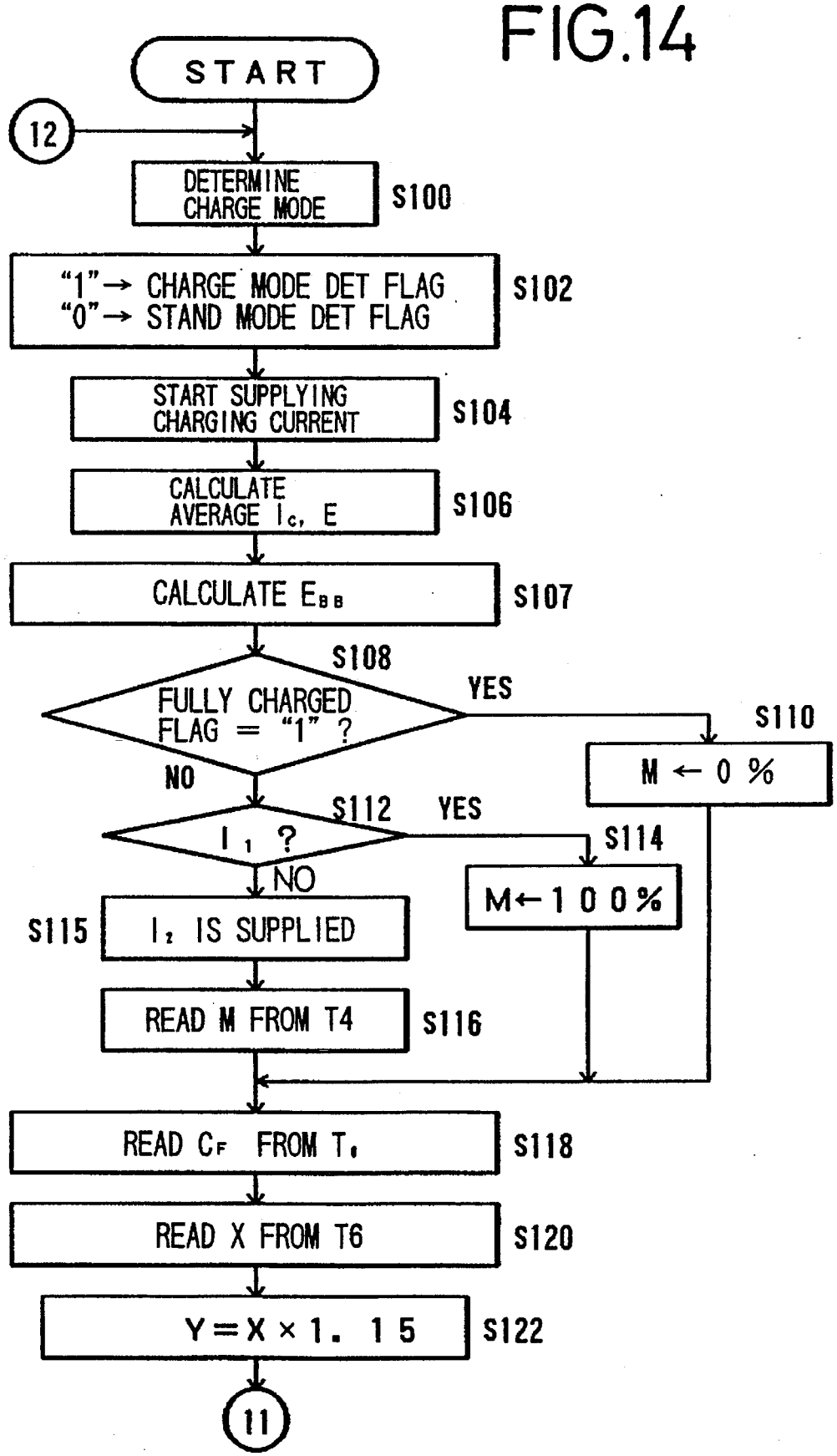
FIGS. 14 and 15 are flowcharts of a process of detecting the residual capacity of the batteries in a charge mode.
Figure 15:
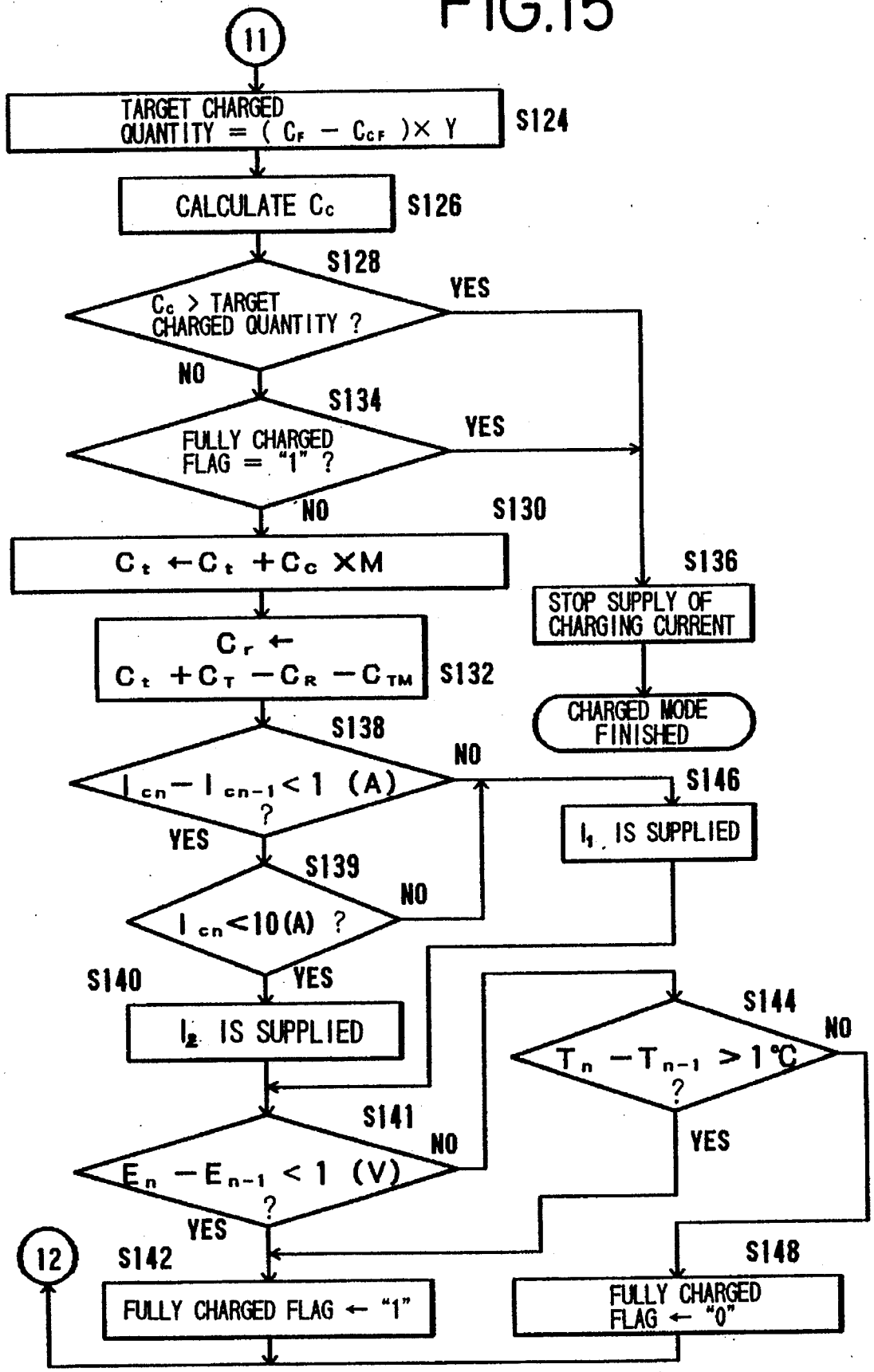

A process of detecting and displaying a residual capacity C of the batteries 12 in the charge mode will be described below with reference to FIGS. 14 and 15.

Figure 16A:
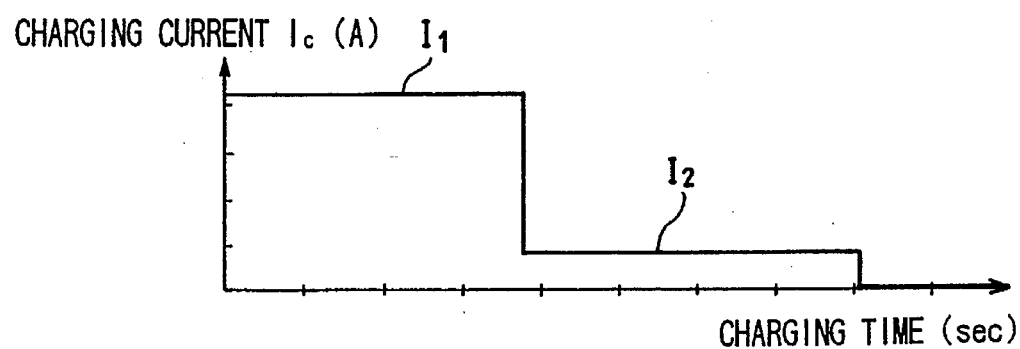
FIG. 16A is a graph showing the waveforms of charging currents supplied from a battery charger to batteries.
Figure 16B:
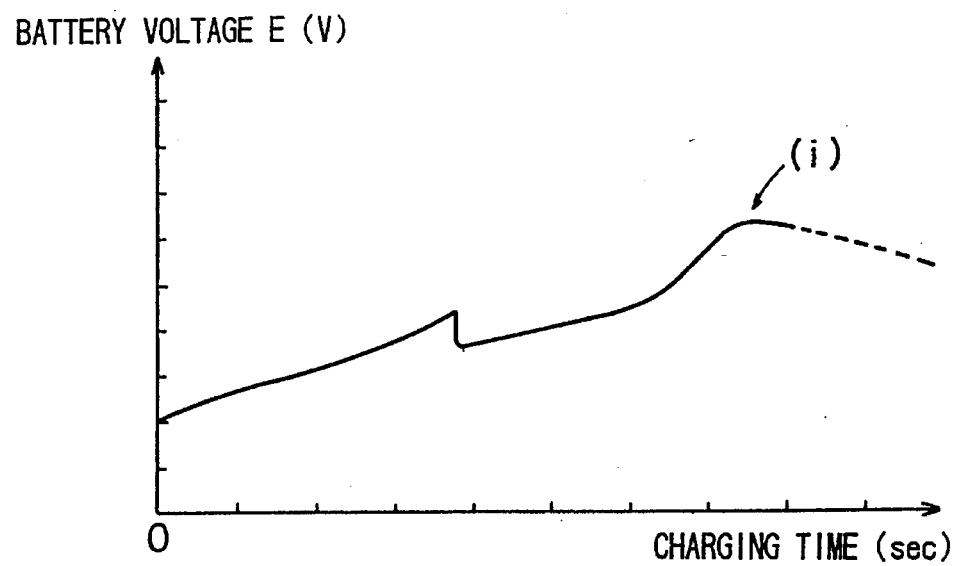
FIG. 16B is a graph showing how the voltage across the batteries varies when they are charged by the charging currents shown in FIG. 16A.

In this embodiment, the batteries 12 are charged by a two-stage constant-current charging process in which a first current $I_1$ is supplied for a predetermined period of time to charge the batteries 12 and thereafter a second current $I_2$ which is lower than the first current $I_1$ is supplied to charge the batteries 12. FIG. 16A shows the waveforms of the first and second currents $I_1$, $I_2$. FIG. 16B shows how the waveform of the battery voltage E varies when the batteries 12 are charged by the first and second currents $I_1$, $I_2$ shown in FIG. 16A.

When the charging connector 26 connected to the battery charger 14 is joined to the charging connector 24 on the electric vehicle, the connection sensor 28 associated with the charging connector 24 outputs a connection signal to the ECU 22. The ECU 22 now determines that the batteries 12 are in the charge mode in a step S100 (see FIG. 14), and sets a standing mode determining flag to "0" in a step S102. The ECU 22 also outputs a signal to operate the switcher 34 to disconnect the motor Mo from the batteries 12.

Then, the battery charger 14 starts supplying a charging current $I_c$ to the batteries 12 in a step S104. Data of the charging current $I_c$ detected by the current detector 16 are supplied to the ECU 22, and data of the battery voltage E detected by the voltage detector 18 are supplied to the ECU 22.

The charging current $I_c$ and the battery voltage E are sampled at predetermined sampling times, e.g., at a period of 100 msec. Specifically, 600 data per minute of the charging current $I_c$ and 600 data per minute of the battery voltage E are read by the ECU 22, and stored in the discharge current data storage area 44b and the battery voltage data storage area 44c, respectively. The ECU 22 calculates an average charging current $I_c$ for one minute and an average value of the battery voltage E for one minute in a step S106, and then calculates a battery voltage $E_{BB}$ per battery in a step S107.

The ECU 22 determines whether a fully charged flag is set to "1" or not, i.e., whether the batteries 12 are fully charged or not, in a step S108. If the batteries 12 are fully charged, then the ECU 22 determines that the charging current $I_c$ supplied from the battery charger 14 is all converted to heat without being converted into a residual capacity C, and that the proportion (charging efficiency M) of a current which is converted into the residual capacity $C_t$ in the batteries 12, of the supplied charging current $I_c$ is 0%, and stores the charging efficiency M of 0% in the charging efficiency storage area 44i in a step S110.

If the fully charged flag is not set to "1" in the step S108, then the ECU 22 determines that the batteries 12 are not fully charged, and determines whether the charging current $I_c$ supplied from the battery charger 14 is the first current $I_1$ or not in a step S112. If the supplied charging current $I_c$ is the first current $I_1$, then the ECU 22 determines that the supplied charging current $I_c$ is all converted into the residual capacity $C_t$ in the batteries 12, i.e., the charging efficiency M is 100%, and stores the charging efficiency M of 100% in the charging efficiency storage area 44i in a step S114.

If the supplied charging current $I_c$ is not the first current $I_1$, then the ECU 22 determines that the second current $I_2$ is supplied from the battery charger 14 in a step S115. Based on the battery voltage $E_{BB}$ calculated in the step S107, the ECU 22 reads a charging efficiency M from the look-up table T4 stored in the LUT memory 46, and stores the read charging efficiency M in the charging efficiency storage area 44i in a step S116.

In the steps S108–S116, either the charging efficiency M of 0%, or the charging efficiency M of 100%, or the charging efficiency M read from the look-up table T4 is stored in the charging efficiency storage area 44i.

Then, the ECU 22 reads a battery temperature T through the temperature detector 20, and reads a temperature corrective capacity $C_r$ from the look-up table $T_2$ based on the read battery temperature T, and the temperature corrective capacity $C_T$ is stored in the RAM 44 in a step 118.

At the same time, the ECU reads a temperature corrective coefficient X of a charging rate Y from the look-up table T6 based on the battery temperature T in a step S120, and multiplies the temperature corrective coefficient X by a certain marginal percentage, e.g., 115%, thus producing the charging rate Y (Y=X×1.15) in a step S122. The charging rate Y represents the difference between the rated capacity $C_F$ and the present corrected residual capacity $C_r$ of the batteries 12, i.e., a coefficient of a target charge quantity.

Then, the ECU 22 subtracts an initial value of the uncorrected residual capacity $C_t$ of the batteries 12, which has been determined when the batteries 12 start being charged, from the rated capacity $C_F$ of the batteries 12, thereby determining a target charge quantity, and multiplies the target charge quantity by the charging rate Y that has been temperature-compensated, thereby determining a target charge quantity according to the following equation (6) in a step S124 (see FIG. 15):

$$\text{Target charge quantity} = (C_F - C_{CF}) \times Y \tag{6}$$

Since the charging rate Y has been multiplied by 115% in the step S122, the target charge quantity is set to a value which is 15% higher than the rated capacity $C_F$.

Then, the ECU calculates charging quantities $\Delta C_c$ for one minute from the average charging current $I_{CA}$ calculated in the step S106, and integrates the charging quantities $\Delta C_c$ into an integrated charging quantity $C_c$ in a step S126.

The ECU 22 then determines whether the integrated charging quantity $C_c$ is greater than the target charge quantity or not in a step S128. If the integrated charging quantity $C_c$ is not greater than the target charge quantity, then the ECU 22 determines whether the fully charged flag has been set to "1" or not in a step S134. If the fully charged flag has not been set to "1", then a present corrected residual capacity $C_r$ is calculated as follows:

The ECU 22 multiplies the integrated charging quantity $C_c$ which has been integrated from the start of the charge mode by the charging efficiency M which is stored in the RAM 44 in the step S110, S114, or S116, thus determining a charge quantity ($C_c \times M$), and a present corrected residual capacity $C_r$ is calculated from the charge quantity ($C_c \times M$) and the initial value of the uncorrected residual capacity $C_t$ according to the following equation (7) in a step S130:

$$C_r \leftarrow C_t + C_c \times M \qquad (7)$$

Then, the ECU 22 calculates a corrected residual capacity $C_r$ by correcting the uncorrected residual capacity $C_t$ with the temperature corrective capacity $C_T$ read in the step S118 and the degradation corrective capacity $C_R$ and the temporary corrective capacity $C_{TM}$ which have been calculated and stored in the residual capacity corrective data storage area 44f in a previous charge mode according to the following equation (8) in a step S132:

$$C_r \leftarrow C_t + C_T - C_R - C_{TM}. \qquad (8)$$

If the integrated charge quantity $C_c$ is greater than the target charge quantity in the step S128, then the ECU 22 determines that the integrated charge quantity $C_c$ has reached the target charge quantity, i.e., the batteries 12 have sufficiently been charged. The ECU 22 outputs a signal to stop the supply of the charging current $I_c$ from the battery charger 14 to the batteries 12 in a step S136, thereby finishing the charge mode.

If the fully charged flag has been set to "1" in the step S134, then the ECU 22 determines that the integrated charge quantity $C_c$ has reached the target charge quantity, and stops the supply of the charging current $I_c$ from the battery charger 14 to the batteries 12 in the step S136.

The fully charged flag used to determine whether the charge mode is to be finished or not is set as a result of a fully charged condition determining subroutine which is executed at a predetermined period, e.g., every 30 minutes.

The fully charged condition determining subroutine will be described below.

The ECU 22 reads a present charging current $I_{cn}$ and determines the difference between the present charging current $I_{cn}$ and a previous charging current $I_{cn-1}$, i.e., a charging current supplied 30 minutes ago and stored in the RAM 44, is smaller than 1 (A) or not in a step S138. If the current difference is smaller than 1 (A), then the ECU 22 determines that the charging current $I_c$ has not changed from the first current $I_1$ to the second current $I_2$ in the 30 minutes.

Then, the ECU 22 determines whether the present charging current $I_{cn}$ is smaller than, i.e., 10 (A) in a step S139. If the present charging current $I_{cn}$ is smaller than 10 (A), then the ECU 22 determines that the second current $I_2$ is supplied from the battery charger 14 to the batteries 12 in a step S140. The ECU 22 determines whether the difference between a present battery voltage $E_n$ and a previously measured battery voltage $E_{n-1}$ is smaller than a preset value, e.g., 1 (V), or not in a step S141. If the difference is smaller than 1 (V), then the ECU 22 sets the fully charged flag to "1" in a step S142, and repeats the step S100 and following steps again. Since the fully charged flag has been set to "1", control goes from the step S134 to the step S136 to finish the charge mode.

If the voltage difference is not smaller than 1 (V) in the step S141, since the batteries 12 are not fully charged, the ECU 22 determines that the battery voltage E is increasing, and determines whether the difference between a present battery temperature $T_n$ and a previously measured battery temperature $T_{n-1}$ which has been stored in the battery temperature storage area 44h is greater than a preset value, e.g., 1° C., or not in a step S144. If the temperature difference is greater than 1° C., then the ECU 22 determines that the batteries 12 are fully charged, and sets the fully charged flag to "1" in the step S142.

More specifically, when the batteries 12 are fully charged, the rate of increase of the battery voltage E is lowered (see FIG. 16B at (i)), and a greater proportion of the charging current $I_c$ is converted into heat, so that the battery temperature T increases. Consequently, if the battery voltage E varies within 1 (V) or the battery temperature T varies beyond 1° C. while the second current $I_2$ is being supplied from the battery charger 14 to the batteries 12, then the batteries 12 are determined as being fully charged.

If the difference between the present charging current $I_{cn}$ and the previous charging current $I_{cn-1}$ stored in the RAM 44 is not smaller than 1 (A) in the step S138, or if the charging current $I_c$ is not smaller than 10 (A) in the step S139, then the ECU 22 determines that the first current $I_1$ is being supplied from the battery charger 14 to the batteries 12 in a step S146, and then executes the step S141 and following steps. If the voltage difference is not smaller than 1 (V) in the step S141 and also if the temperature difference is not greater than 1° C. in the step S144, then the ECU 22 determines that the batteries 12 are not fully charged, and sets the fully charged flag to "0" in a step S148, and then executes the step S100 and following steps again.

As described above, in the charge mode, the charging efficiency M is calculated from the changes of the battery voltage E, multiplied by the integrated charge quantity $C_c$, and thus a sufficient charge quantity is set with respect to the rated capacity $C_F$.

By correcting the target charge quantity based on the battery temperature T, a short or excess of the charge quantity caused by the temperature change may be avoided.

Figure 17:
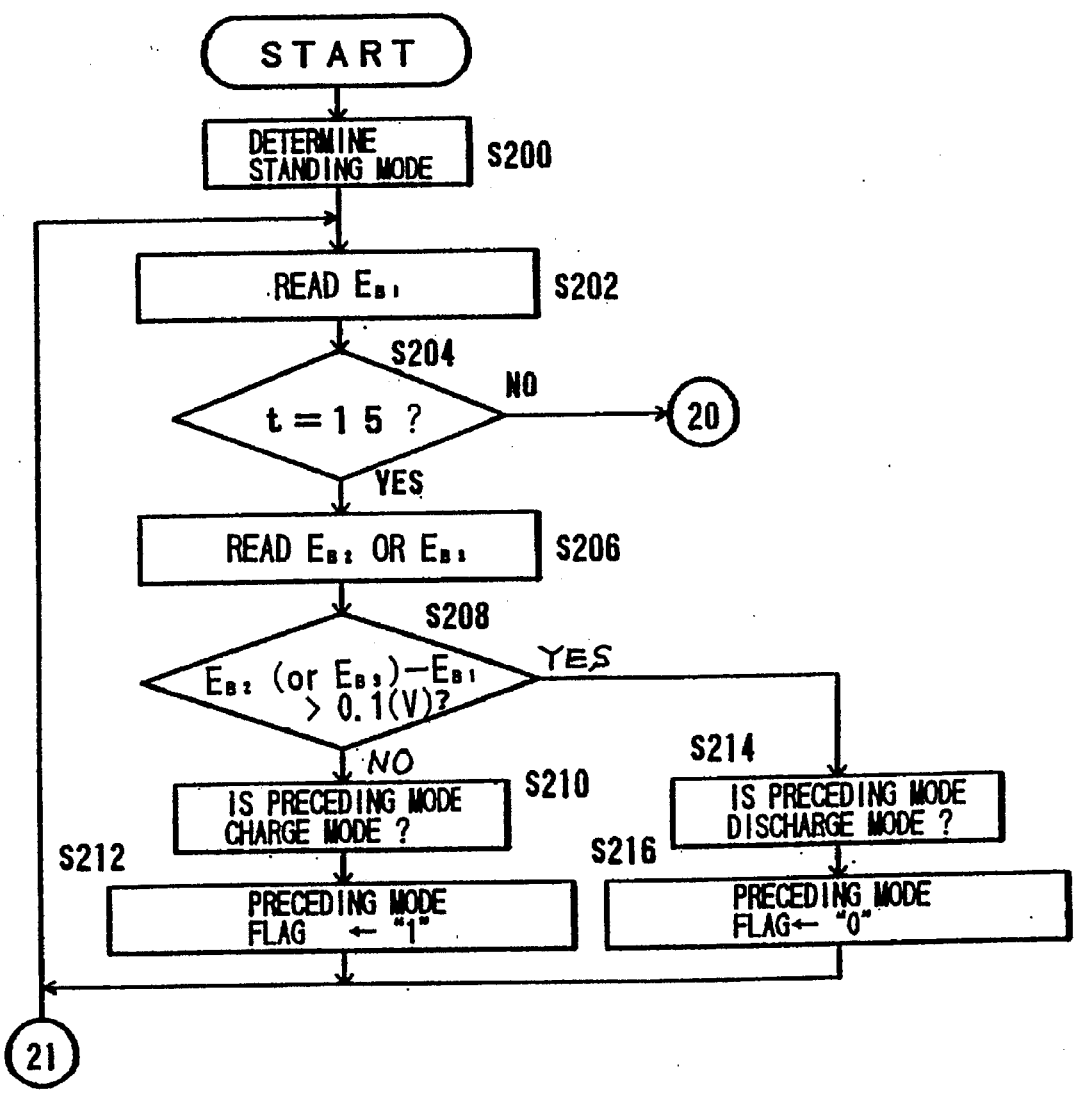
FIGS. 17 and 18 are flowcharts of a process of detecting the residual capacity of the batteries in a standing mode.

A process of detecting a residual capacity C of the batteries 12 in the standing mode will be described below with reference to FIGS. 17 and 18.

When the ignition key is removed from the ignition switch 30, thus finishing the discharge mode, or the charging connector 26 is disconnected, thus finishing the charge mode, the ECU 22 determines that the batteries 12 are in a standing mode in a step S200 (see FIG. 17), and reads a battery voltage E at the time the batteries 12 are determined as being in the standing mode, as an initial battery voltage $E_{B1}$ in the standing mode in a step S202.

Then, the ECU 22 determines whether time t that has elapsed after the batteries 12 are determined as being in the standing mode has reached 15 minutes or not in a step S204. If 15 minutes have been reached, then the ECU 22 reads a battery voltage $E_{B2}$ or $E_{B3}$ in a step S206, and determines whether the battery voltage $E_{B2}$ or $E_{B3}$ has increased 0.1 (V) from the initial battery voltage $E_{B1}$ or not in a step S208. If the battery voltage $E_{B2}$ or $E_{B3}$ has not increased 0.1 (V) from the initial battery voltage $E_{B1}$, then the ECU 22 determines that the preceding mode was the charge mode in a step S210, and then sets a preceding mode flag to "1" in a step S212.

If the battery voltage $E_{B2}$ or $E_{B3}$ has increased 0.1 (V) from the initial battery voltage $E_{B1}$, then the ECU 22 determines that the preceding mode was the discharge mode in a step S214, and then sets a preceding mode flag to "0" in a step S216.

As shown in FIG. 19, after the charge mode is finished, the battery voltage E tends to drop and become stable after elapse of a predetermined time $t_x$, and after the discharge mode is finished, the battery voltage E tends to increase immediately after the discharge mode. Therefore, the preceding mode can be determined based on whether the battery voltage $E_{B2}$ or $E_{B3}$ has decreased or increased from the initial battery voltage $E_{B1}$ after elapse of 15 minutes.

Figure 18:
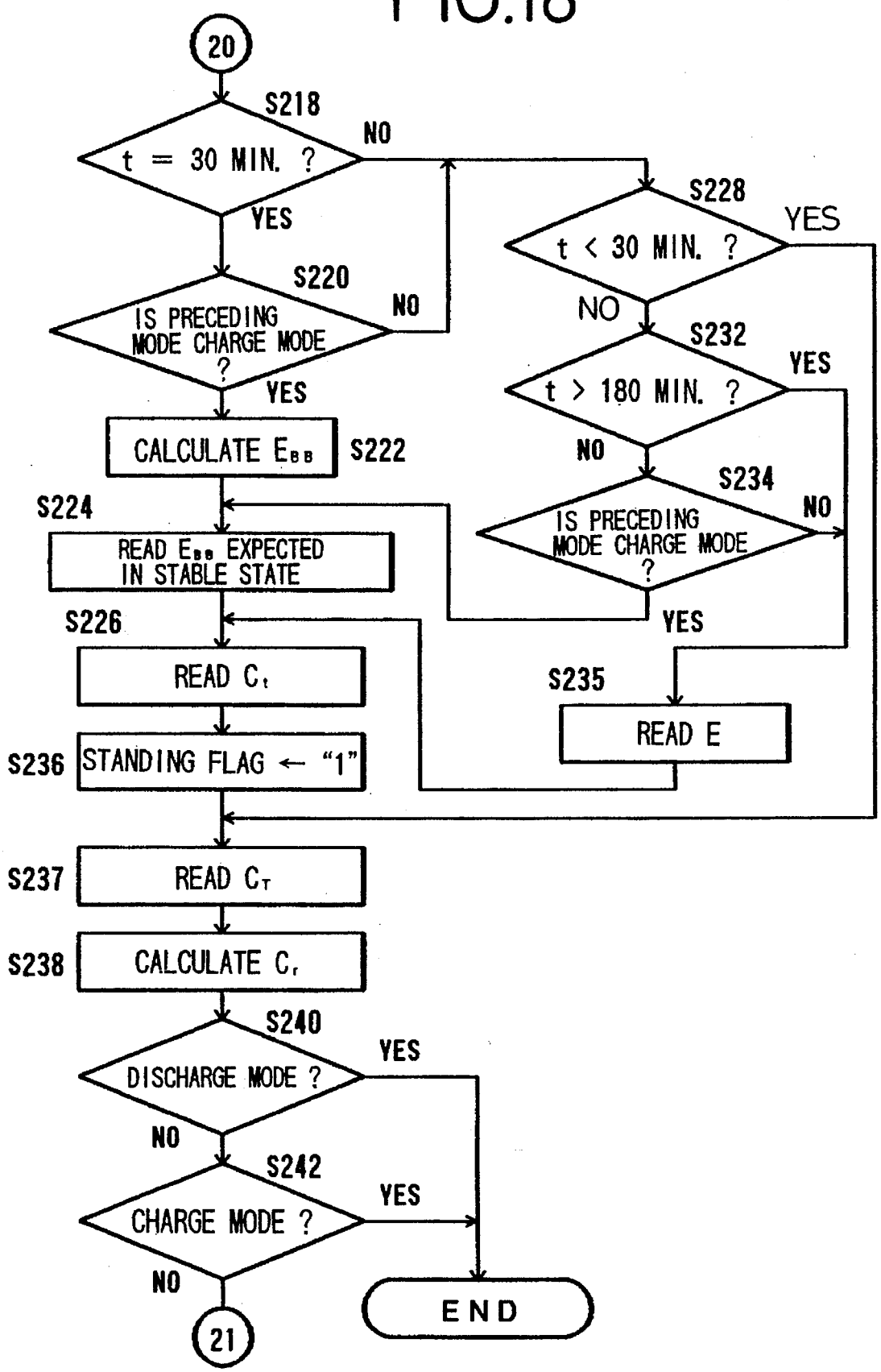

Then, the ECU 22 determines whether the time t that has elapsed after the batteries 12 are determined as being in the standing mode has reached 30 minutes in a step S218 (see FIG. 18). If the time t has reached 30 minutes, then the ECU 22 determines whether the preceding mode flag is "1" or not, i.e., whether the preceding mode is the charge mode or not, in a step S220. If the preceding mode is the charge mode, the ECU 22 reads the battery voltage $E_{B2}$ at this time through the voltage detector 18, and calculates a battery voltage $E_{BB}$ per battery in a step S222.

The ECU 22 reads a battery voltage $E_{BB}$ per battery which is expected to be in a stable state of the battery voltage after elapse of the time $t_x$ from the look-up table T5 based on the calculated battery voltage $E_{BB}$ per battery in a step S224. The ECU 22 reads an uncorrected residual capacity $C_t$ from the look-up table T1 based on the read battery voltage $E_{BB}$, and stores the uncorrected residual capacity $C_t$ in the uncorrected residual capacity storage area 44e in a step S226.

If the time t has not reached 30 minutes, then the ECU 22 determines whether the time t is smaller than 30 minutes or not in a step S228. If the time t has exceeded 30 minutes, then the ECU 22 determines whether the time t has exceeded 180 minutes or not in a step S232. If the time t has not exceeded 180 minutes, i.e., if the time t has exceeded 30 minutes, but is smaller than 180 minutes, then the ECU 22 reads the preceding mode flag and determines whether the preceding mode is the charge mode or not in a step S234. If the preceding mode flag is "1", i.e., if the preceding mode is the charge mode, the ECU 22 executes the step S224 and following steps to read an uncorrected residual capacity $C_t$ from the look-up table T1 based on a battery voltage $E_{BB}$ per battery which is expected to be stable, and store the read uncorrected residual capacity $C_t$ in the uncorrected residual capacity storage area 44e.

Since the uncorrected residual capacity $C_t$ is read from the look-up table T1, the uncorrected residual capacity $C_t$ is not determined based on the battery voltage E which is decreasing after the batteries 12 have been charged, but determined based on the battery voltage $E_{BB}$ per battery which is expected to be in the stable state of the battery voltage. Therefore, the charged quantity is prevented from becoming insufficient at the time the batteries 12 are charged immediately thereafter, because the uncorrected residual capacity $C_t$ based on the battery voltage $E_{BB}$ after it has become stable is smaller than the uncorrected residual capacity $C_t$ based on the battery voltage $E_{BB}$ immediately after the charging mode is finished.

If the time t has exceeded 180 minutes in the step S232, or if the preceding mode flag is not "1", i.e., the preceding mode is not the charge mode, in the step S234, the ECU 22 reads the battery voltage E at predetermined sampling times in a step S235, and then reads an uncorrected residual capacity $C_t$ at the battery voltage E from the look-up table T1 in which the uncorrected residual capacity $C_t$ has been stored in the step S226. The ECU 22 updates the preceding uncorrected residual capacity $C_t$ stored in the uncorrected residual capacity storage area 44e into the uncorrected residual capacity $C_t$ thus read.

When the uncorrected residual capacity $C_t$ is read from the look-up table T1, the ECU 22 sets the standing flag to "1" in a step S236. The standing flag "1" indicates that an integration error of the uncorrected residual capacity $C_t$ due to the integration of charge quantities $\Delta C_c$ or the integration of discharge quantities $\Delta C$, of the uncorrected residual capacity $C_t$ which has been calculated in the discharge mode, is canceled.

More specifically, for determining an uncorrected residual capacity $C_t$ by integrating discharge quantities $\Delta C$, an average discharge current $I_{DA}$ of discharge currents $I_D$ for one minute is calculated. When the average discharge current $I_{DA}$ is determined, an error is produced. Such errors are integrated to introduce an integration error into the calculated uncorrected residual capacity $C_t$. When the uncorrected residual capacity $C_t$ which contains an integration error of discharge quantities $\Delta C$ is updated into the uncorrected residual capacity $C_t$ read from the look-up table T1, the integration error of the uncorrected residual capacity $C_t$ is canceled.

If the time t is shorter than 30 minutes in the step S228, then a temperature corrective capacity $C_t$ is determined in a step S237.

If the time t has exceeded 180 minutes or if the time t has exceeded 30 minutes and shorter than 180 minutes and the preceding mode is not the charge mode, the ECU 22 calculates a battery voltage $E_{BB}$ per battery from the battery voltage E that has been detected at predetermined sampling times, and reads an uncorrected residual capacity $C_t$ from the look-up table T1 based on the calculated battery voltage $E_{BB}$ per battery.

If the preceding mode flag is not "1" in the step S220, the ECU 22 determines that the preceding mode is the discharge mode, and executes the step S228 and following steps.

The ECU 22 reads a battery temperature T through the temperature detector 20, and reads a temperature corrective capacity $C_T$ from the look-up table T2 based on the read battery temperature T in the step S237. The ECU 22 calculates a corrected residual capacity $C_r$ by correcting the uncorrected residual capacity $C_t$ with the temperature corrective capacity $C_T$ read in the step S237 and the degradation corrective capacity $C_R$ and the temporary corrective capacity $C_{TM}$ which have been calculated and stored in the residual capacity corrective data storage area 44f according to the equation: $C_r \leftarrow C_t + C_T - C_R - C_{TM}$ in a step S238.

Then, the ECU 22 repeatedly executes the step S202 and following steps to calculate the corrected residual capacity $C_r$ until it determines the batteries 12 as being in the discharge mode in a step S240 or as being in the charge mode in a step S242.

In the standing mode, as described above, if the preceding mode is the discharge mode, then an uncorrected residual capacity $C_t$ is determined using a detected battery voltage E, and if the preceding mode is the charge mode, then an uncorrected residual capacity $C_t$ is determined using a battery voltage $E_{BB}$ which is expected to be in a stable state of the battery voltage. Consequently, since an uncorrected residual capacity $C_t$ is not calculated on the basis of a battery voltage E which is temporarily higher if the preceding mode is the charge mode, an uncorrected residual capacity $C_t$ is prevented from being calculated as a level higher than a virtual residual capacity C.

For detecting the residual capacity of the batteries when they are left to stand after being charged or discharged, the method according to the present invention determines whether the batteries have been charged or discharged before they are left to stand, based on a change in the battery voltage after the batteries are left to stand. If the batteries have been charged before they are left to stand, then the residual capacity of the batteries is detected based on the battery voltage which is expected to be in a stable state settled after elapse of a predetermined period of time. Therefore, the residual capacity of the batteries while they are being left to stand is not detected based on a high battery voltage before it becomes stable, and hence can be detected with high accuracy.

Although a certain preferred embodiment of the present invention has been shown and described in detail, it should be understood that various changes and modifications may be made therein without departing from the scope of the appended claims.

What is claimed is:

1. A method of detecting the residual capacity of a battery for energizing an electric motor to propel an electric vehicle while the battery is being discharged, based on an initial value of the residual capacity of the battery upon a transition of the battery to a discharging condition and a discharge current at predetermined periods from said battery after said transition, said method comprising the steps of:

(a) calculating a maximum output which can be produced from said battery based on the discharge current from said battery and a battery voltage while the battery is being discharged;

(b) calculating a maximum output density by dividing said maximum output by a weight of said battery and determining whether the residual capacity of the battery is virtually zero or not based on the maximum output density;

(c) calculating a degradation error corrective capacity for correcting for a change in the residual capacity due to a degradation of the battery when the residual capacity of said battery is virtually zero; and (d) correcting the residual capacity of said battery which has been calculated based on the initial value of the residual capacity of the battery and the discharge current from said battery, with said degradation error corrective capacity, for thereby calculating the residual capacity of said battery while the battery is being discharged.

2. A method of detecting the residual capacity of a battery for energizing an electric motor to propel an electric vehicle while the battery is being discharged, based on an initial value of the residual capacity of the battery upon a transition of the battery to a discharging condition and a discharge current at predetermined periods from said battery after said transition, said method comprising the steps of:

(a) detecting a battery voltage at predetermined periods while the battery is being discharged;

(b) determining whether the detected battery voltage while the battery is being discharged is lower than a preset value or not;

(c) determining the residual capacity of the battery as being virtually zero when the detected battery voltage while the battery is being discharged is determined as being lower than said preset value, to calculate a degradation error corrective capacity for correcting for a change in the residual capacity due to a degradation of the battery; and (d) correcting the residual capacity of said battery which has been calculated based on the initial value of the residual capacity of the battery and the discharge current from said battery, with said degradation error corrective capacity, for thereby calculating the residual capacity of said battery while the battery is being discharged.

3. A method according to claim 1, wherein said step (c) includes the step of calculating said degradation error corrective capacity based on whether an integration error of the discharge current from said battery has been canceled or not.

4. A method according to claim 2, wherein said step (c) includes the step of calculating said degradation error corrective capacity based on whether a integration error of the discharge current from said battery has been canceled or not.

5. A method according to claim 1, wherein said step (d) includes the steps of calculating a discharge current corrective capacity to correct for a change in the residual capacity due to an average discharge current, and correcting the residual capacity of said battery with said discharge current corrective capacity.

6. A method according to claim 2, wherein said step (d) includes the steps of calculating a discharge current corrective capacity to correct for a change in the residual capacity due to an average discharge current, and correcting the residual capacity of said battery with said discharge current corrective capacity.

7. A method according to claim 1, wherein said step (d) includes the steps of calculating a temperature corrective capacity to correct for a change in the residual capacity due to a battery temperature based on said battery temperature, and correcting the residual capacity of said battery with said temperature corrective capacity.

8. A method of detecting the residual capacity of a battery for energizing an electric motor to propel an electric vehicle upon a transition of the battery to a charging condition, comprising the steps of:

(a) detecting a residual capacity of the battery based on a battery voltage at the time the battery starts being charged, and calculating a required charge quantity from the detected residual capacity and a stored rated capacity of the battery;

(b) detecting a battery temperature, and determining a temperature corrective coefficient to correct said required charge quantity with the battery temperature, based on said battery temperature;

(c) calculating a target charge quantity at said battery temperature from said required charge quantity and said temperature corrective coefficient;

(d) determining a charging efficiency representative of a proportion of a charging current supplied to the battery which is converted into a residual capacity, based on the battery voltage while the battery is being charged; and (e) determining an actual charge quantity from an integrated charge quantity indicative of an integrated average charging current and said charging efficiency.

9. A method according to claim 8, further comprising the step of outputting a signal to stop supplying the charging current to the battery when the actual charge quantity has reached at least one of either said target charge quantity or a fully charged capacity of the battery.

10. A method according to claim 9, further comprising the step of setting a fully charged flag to provide information indicating that the residual capacity of the battery has reached said target charge quantity when a change in the battery voltage is lower than a preset value or a change in the battery temperature is higher than a preset value.

11. A method of detecting the residual capacity of a battery for energizing an electric motor to propel an electric vehicle when the battery is left to stand after the battery has been either charged or discharged, comprising the steps of:

(a) detecting a first battery voltage immediately after the battery is left to stand and a second battery voltage upon elapse of a predetermined time after the battery is left to stand, and calculating the difference between said first battery voltage and said second battery voltage;

(b) determining whether the battery has been in a charging condition or a discharging condition immediately before the battery is left to stand, based on said calculated difference;

(c) reading a third battery voltage corresponding to said second battery voltage from first memory means which stores said third battery voltage as a voltage which is expected to be in a stable state of the battery voltage in a manner to correspond to said second battery voltage, when the battery is determined as having been in the charging condition; and (d) reading a residual capacity of the battery corresponding to the read third battery voltage from second memory means which stores said residual capacity in a manner to correspond to said third battery voltage.

12. A method of detecting the residual capacity of a battery for energizing an electric motor to propel an electric vehicle when the battery is left to stand after the battery has been either charged or discharged, comprising the steps of:

(a) detecting a first battery voltage immediately after the battery is left to stand and a second battery voltage upon elapse of a predetermined time after the battery is left to stand, and calculating the difference between said first battery voltage and said second battery voltage;

(b) determining whether the battery has been in a charging condition or a discharging condition immediately before the battery is left to stand, based on said calculated difference; and (c) reading a residual capacity of the battery corresponding to said second battery voltage from memory means which stores said residual capacity in a manner to correspond to said second battery voltage, when the battery is determined as having been in the discharging condition immediately before the battery is left to stand.

13. A method according to claim 11, wherein said step (d) includes a step of correcting the residual capacity of the battery with a corrective value for correcting a battery capacity based on at least one of a degradation of the battery and a corrective value for correcting a battery capacity based on an integration error which occurs when the residual capacity is calculated while the battery is in the charging condition, thereby producing a corrected residual capacity.

14. A method according to claim 12, wherein said step (c) includes a step of correcting the residual capacity of the battery with a corrective value for correcting a battery capacity based on at least one of degradation of the battery and a corrective value for correcting a battery capacity based on an integration error which occurs when the residual capacity is calculated while the battery is in the charged condition, thereby producing a corrected residual capacity.

15. A method according to claim 13, wherein said step of correcting the residual capacity of the battery includes a step of correcting the residual capacity of the battery with a battery temperature.

16. A method according to claim 14, wherein said step of correcting the residual capacity of the battery includes a step of correcting the residual capacity of the battery with a battery temperature.

17. A method of detecting the residual capacity of a battery for energizing an electric motor to propel an electric vehicle while the battery is being discharged, based on an initial value of the residual capacity of the battery upon a transition of the battery to a discharging condition and a discharge current at predetermined periods from said battery after said transition, said method comprising the steps of:

(a) calculating a maximum output which can be produced from said battery based on the discharge current from said battery and a battery voltage while the battery is being discharged;

(b) calculating a maximum output density by dividing said maximum output by a weight of said battery and determining whether the residual capacity of the battery is virtually zero or not based on the maximum output density;

(c) calculating an integration error corrective capacity for correcting for an integration error of the discharged current from said battery, when the residual capacity of said battery is virtually zero; and (d) correcting the residual capacity of said battery which has been calculated based on the initial value of the residual capacity of the battery and the discharge current from said battery, with said integration error corrective capacity, for thereby calculating the residual capacity of said battery while the battery is being discharged.

18. A method according to claim 17, wherein said step (c) includes the step of calculating said integration error corrective capacity based on whether an integration error of the discharge current from said battery has been cancelled or not.

19. A method according to claim 17, wherein said step (d) includes the steps of calculating a discharge current corrective capacity to correct for a change in the residual capacity due to an average discharge current, and correcting the residual capacity of said battery with said discharge current corrective capacity.

20. A method according to claim 17, wherein said step (d) includes the steps of calculating a temperature corrective capacity to correct for a change in the residual capacity due to a battery temperature based on said battery temperature, and correcting the residual capacity of said battery with said temperature corrective capacity.

21. A method according to claim 17 further including a step of calculating a degradation error corrective capacity for correcting for a change in the residual capacity of the battery due to degradation of the battery when the residual capacity of the battery is virtually zero, a step of determining when an error in the residual capacity of the battery is caused by said degradation error corrective capacity, and then cancelling the calculated integration error corrective capacity and correcting the residual capacity of the battery with said degradation error corrective capacity.

22. A method according to claim 17 further including a step of calculating a degradation error corrective capacity for correcting for a change in the residual capacity of the battery due to degradation of the battery when the residual capacity of the battery is virtually zero, a step of determining when an error in the residual capacity of the battery is caused by said integration error corrective capacity, and then cancelling the calculated degradation error corrective capacity and correcting the residual capacity of the battery with said integration error corrective capacity.

23. A method according to claim 17 further including a step of calculating a degradation error corrective capacity for correcting for a change in the residual capacity of the battery due to degradation of the battery when the residual capacity of the battery is virtually zero, and selectively correcting the residual capacity of the battery with said degradation error corrective capacity and said integration error corrective capacity.

24. A method of detecting the residual capacity of a battery for energizing an electric motor to propel an electric vehicle while the battery is being discharged, based on an initial value of the residual capacity of the battery upon a transition of the battery to a discharging condition and a discharge current at predetermined periods from said battery after said transition, said method comprising the steps of:

(a) detecting a battery voltage at predetermined periods while the battery is being discharged;

(b) determining whether the detected battery voltage while the battery is being discharged is lower than a preset value or not;

(c) determining the residual capacity of the battery as being virtually zero when the detected battery voltage while the battery is being discharged is determined as being lower than said preset value, to calculate an integration error corrective capacity for correcting for an integration error of the discharge current from said battery; and (d) correcting the residual capacity of said battery which has been calculated based on the initial value of the residual capacity of the battery and the discharge current from said battery, with said integration error corrective capacity, for thereby calculating the residual capacity of said battery while the battery is being discharged.

25. A method according to claim 24, wherein said step (c) includes the step of calculating said integration error corrective capacity based on whether an integration error of the discharge current from said battery has been cancelled or not.

26. A method according to claim 24, wherein said step (d) includes the steps of calculating a discharge current corrective capacity to correct for a change in the residual capacity due to an average discharge current, and correcting the residual capacity of said battery with said discharge current corrective capacity.

* * * * *